US011349374B2

(12) United States Patent
Yoshinaga et al.

(10) Patent No.: US 11,349,374 B2
(45) Date of Patent: May 31, 2022

(54) MOTOR

(71) Applicant: NIDEC CORPORATION, Kyoto (JP)

(72) Inventors: Masaki Yoshinaga, Kyoto (JP);
Tomohiro Fukumura, Kyoto (JP);
Taro Amagai, Kyoto (JP); Akiko
Ikeda, Kyoto (JP); Kengo Araki,
Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 123 days.

(21) Appl. No.: 16/846,410

(22) Filed: Apr. 13, 2020

(65) Prior Publication Data
US 2020/0366162 A1    Nov. 19, 2020

(30) Foreign Application Priority Data

May 14, 2019    (JP) .............................. JP2019-091360

(51) Int. Cl.
G01D 5/244    (2006.01)
H02K 11/215   (2016.01)
H02K 11/33    (2016.01)
H02P 23/14    (2006.01)
G01R 33/00    (2006.01)

(52) U.S. Cl.
CPC ....... *H02K 11/215* (2016.01); *G01R 33/0017* (2013.01); *H02K 11/33* (2016.01); *H02P 23/14* (2013.01)

(58) Field of Classification Search
CPC ...... H02K 11/215; H02P 23/14; G01D 5/2448
See application file for complete search history.

(56) References Cited

U.S. PATENT DOCUMENTS

2014/0347040 A1* 11/2014 Kawase ............... G01D 5/2448
324/207.12

FOREIGN PATENT DOCUMENTS

JP    2012-47630 A    3/2012
KR    200323464 Y1 * 11/2003

* cited by examiner

*Primary Examiner* — Cortez M Cook
(74) *Attorney, Agent, or Firm* — Hauptman Ham, LLP

(57) ABSTRACT

A motor according to a disclosed embodiment includes: a plurality of magnetic sensors that output sine wave signals having a certain phase difference in order in accordance with rotation of a rotor; a signal amplifier that amplifies a difference between an output signal of each of the plurality of magnetic sensors and an average signal that is an average of the output signals of the plurality of magnetic sensors; and a pulse signal generation unit that converts an output signal of the signal amplifier into a pulse signal.

2 Claims, 23 Drawing Sheets

MOTOR

CROSS-REFERENCE TO RELATED APPLICATIONS

The present invention claims priority under 35 U.S.C. § 119 to Japanese Application No. 2019-091360 filed on May 14, 2019, the entire content of which is incorporated herein by reference.

FIELD OF THE INVENTION

The present disclosure relates to a motor.

BACKGROUND

Conventionally, there has been known a circuit that cancels an output offset for a magnetic sensor, such as a Hall element, that changes according to the magnitude of a magnetic force. For example, there has been known an offset cancellation circuit of a Hall element configured to cancel an offset caused by a parasitic capacitance of a capacitor in a circuit.

Meanwhile, a Hall element is widely used as a magnetic sensor to detect a position of a rotor in a motor. A signal of the Hall element is amplified by a signal processing circuit, supplied to a microcontroller, and used for control of motor driving. Here, if an external magnetic field, such as a permanent magnet, is brought close to the motor, an offset occurs in the signal from the magnetic sensor, so that there is a problem that the signal of the Hall element is not accurately transmitted to the microcontroller. However, conventionally, a method for removing the offset caused by the external magnetic field has not been known.

SUMMARY

An exemplary embodiment of the present disclosure is a motor including: a plurality of magnetic sensors that output sine wave signals having a certain phase difference in order in accordance with rotation of a rotor; a signal amplifier that amplifies a difference between an output signal of each of the plurality of magnetic sensors and an average signal that is an average of the output signals of the plurality of magnetic sensors; and a pulse signal generation unit that converts an output signal of the signal amplifier into a pulse signal.

The above and other elements, features, steps, characteristics and advantages of the present disclosure will become more apparent from the following detailed description of the preferred embodiments with reference to the attached drawings.

DETAILED DESCRIPTION

Hereinafter, a motor drive system which is an embodiment of a drive system of the present disclosure will be described.

In the following embodiments, a configuration including at least a three-phase AC motor, a plurality of Hall elements, and a signal processing circuit of each Hall element corresponds to a motor of the present disclosure.

Hereinafter, an embodiment of a motor drive system of the present disclosure will be described with reference to the drawings.

Figure 1:
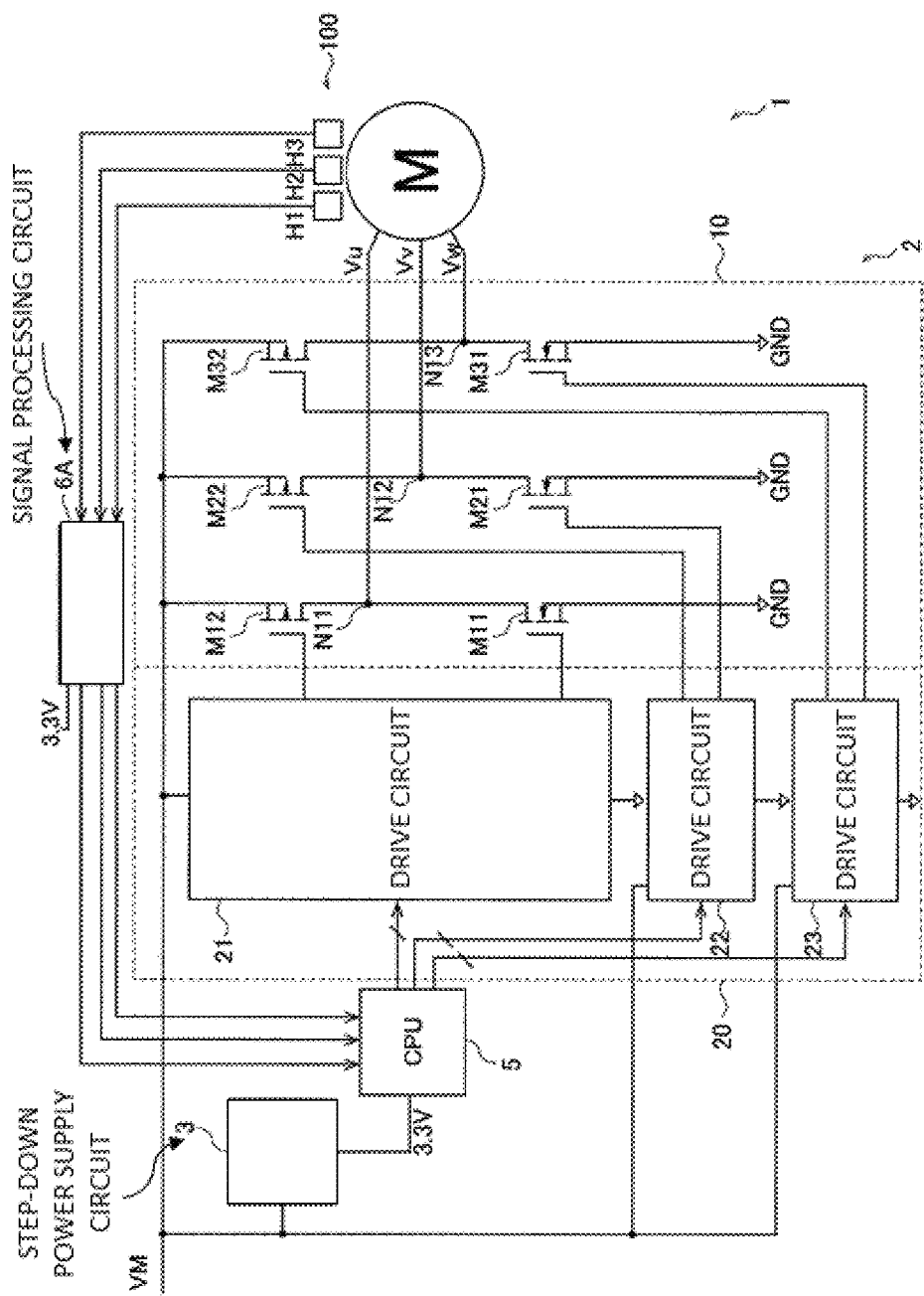
FIG. 1 is a diagram showing a system configuration of a motor drive system according to a first embodiment.

FIG. 1 is a diagram showing a system configuration of a motor drive system 1 according to the embodiment. The motor drive system 1 includes an inverter device 2, a step-down power supply circuit 3, a central processing unit (CPU) 5, and a three-phase AC motor M. The CPU 5 is an example of a microcontroller.

The inverter device 2 includes a three-phase voltage generation unit 10 and a drive circuit group 20, generates three-phase AC power, and supplies the three-phase AC power to a three-phase AC motor M. The three-phase AC motor M is provided with a Hall element group 100 for each phase for detecting a position of a rotor.

In the following description, a voltage of a node or a terminal in a circuit means a potential with a ground potential GND (hereinafter, referred to as a "GND potential") as a reference. For example, the highest potential in the inverter device 2 is a power supply potential VM, but the GND potential may be regarded as 0 V, and accordingly, is also referred to as "power supply voltage VM" as appropriate.

The step-down power supply circuit 3 reduces the power supply voltage VM to a predetermined voltage (+3.3 V in the present embodiment) required for the operation of the CPU 5, and supplies the power supply voltage VM to the CPU 5.

The CPU 5 supplies a pulse signal having an amplitude of 3.3 V to each of drive circuits 21 to 23 of the drive circuit group 20. Each drive circuit converts the pulse signal from the CPU 5 to a signal level at which a MOS transistor in the three-phase voltage generation unit 10 can operate.

In FIG. 1, the drive circuits 21 to 23 respectively correspond to nodes N11 to N13 and correspond to output terminals of a drive circuit to be described below.

Hereinafter, the configuration of the inverter device 2 will be described in detail.

As shown in FIG. 1, the three-phase voltage generation unit 10 of the inverter device 2 includes NMOS transistors M11, M21, and M31 as low-side switches and PMOS transistors M12, M22, and M32 as high-side switches. Since the three-phase AC motor M may operate at 100% duty in some cases, the three-phase voltage generation unit 10 uses the high-side switch as the PMOS transistor.

In the description of the present embodiment, an example in which a high-side switch is a PMOS transistor will be described, but the disclosure is not limited thereto. For example, an NMOS transistor may be applied as the high-side switch using a bootstrap circuit.

In the present embodiment, the PMOS transistor M12 and the NMOS transistor M11 are provided for a U phase of three-phase AC power supplied to the three-phase AC motor M. The PMOS transistor M12 and the NMOS transistor M11 perform the switching operation to generate a U-phase voltage Vu which is a U-phase output voltage.

Similarly, the PMOS transistor M22 and the NMOS transistor M21 are provided for a V phase of the three-phase AC power supplied to the three-phase AC motor M. The PMOS transistor M22 and the NMOS transistor M21 perform the switching operation to generate a V-phase voltage Vv which is a V-phase output voltage. The PMOS transistor 32 and the NMOS transistor M31 are provided for a W phase of the three-phase AC power supplied to the three-phase AC motor M. The PMOS transistor M32 and the NMOS transistor M31 perform the switching operation to generate a W-phase voltage Vw which is a W-phase output voltage.

Each of the NMOS transistors M11, M21, and M31 has a source set to the ground potential GND. Each of the PMOS transistors M12, M22, M32 has a source connected to the power supply voltage VM of the inverter device 2.

A common drain (the node N11) of the NMOS transistor M11 and the PMOS transistor M12 of the U phase is connected to one end of a U-phase winding (not shown) of the three-phase AC motor M. Similarly, a common drain (the node N12) of the NMOS transistor M21 and the PMOS transistor M22 of the V phase is connected to one end of a V-phase winding (not shown) of the three-phase AC motor M, and a common drain (the node N13) of the NMOS transistor M31 and the PMOS transistor M32 of the W phase is connected to one end of a W-phase winding (not shown) of the three-phase AC motor M.

The Hall element group 100 includes three Hall elements H1, H2, and H3. In the following description, when the three Hall elements will be simply described as "Hall elements H" when being commonly referred to. The Hall elements H1 to H3 are elements that detect a position of a rotor magnet of the three-phase AC motor M, and are elements that convert the magnitude of a magnetic force that changes in accordance with the rotation of the rotor magnet (also simply referred to as a "rotor" as appropriate) of the three-phase AC motor M into an electric signal. Signals of the three Hall elements H1, H2, and H3 are complementary signals each of which is a pair of signals inverted from each other with respect to a reference voltage, are sine wave signals having a phase difference of 120 degrees in order, and correspond to the U phase, the V phase, and the W phase, respectively.

A signal processing circuit 6A amplifies a signal of each Hall element H, converts the signal into a pulse signal having an amplitude of 3.3 V, and supplies the pulse signal to the CPU 5. Details of the signal processing circuit 6A will be described below. A duty ratio of the pulse signal supplied from the signal processing circuit 6A is usually 50%, and does not largely deviate from 50%.

The CPU 5 determines the duty ratio of the pulse signal supplied to the driving circuits 21 to 23 of the drive circuit group 20 based on the pulse signal to be supplied by the signal processing circuit 6A, and supplies the pulse signal with the determined duty ratio to each drive circuit. The amplitude of the pulse signal to be supplied to each drive circuit is 3.3 V, which is the same as an operating voltage of the CPU 5.

Each drive circuit of the drive circuit group 20 converts a level of the pulse signal from the CPU 5 having the amplitude of 3.3 V, and inputs the converted pulse signal to a gate of the PMOS transistor and a gate of the NMOS transistor of the three-phase voltage generation unit 10. The drive circuit 21 inputs the level-converted pulse signal to each gate of the NMOS transistor M11 and PMOS transistor M12 of the U phase. The drive circuit 22 inputs the level-converted pulse signal to each gate of the NMOS transistor M21 and PMOS transistor M22 of the V phase. The drive circuit 23 inputs the level-converted pulse signal to each gate of the NMOS transistor M31 and PMOS transistor M32 of the W phase.

The operations of the NMOS transistors M11, M21, and M31 as the low-side switches and the PMOS transistors M12, M22, and M32 as the high-side switches are controlled by the pulse signals whose levels have been converted by the drive circuits 21, 22, and 23, respectively.

Hereinafter, the configuration of the signal processing circuit 6A of the present embodiment will be described in detail, but a reference circuit 6R, which is a signal processing circuit for reference, will be described with reference to FIGS. 2 and 3 first for the purpose of comparison with the signal processing circuit 6A.

Figure 2:
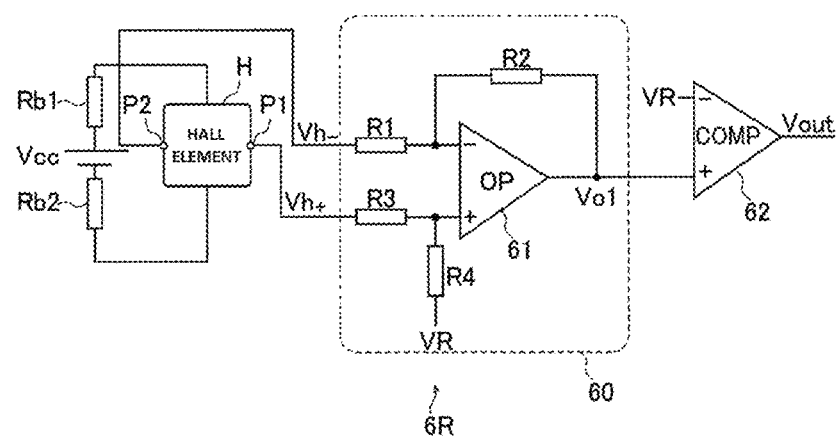
FIG. 2 is a circuit diagram of a reference circuit.
Figure 3A:
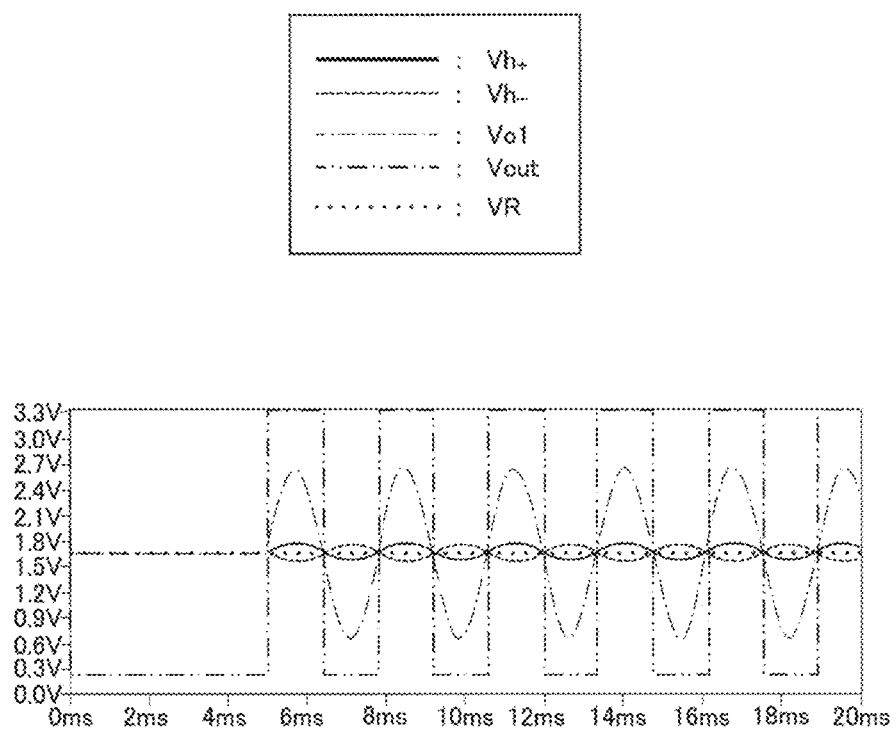
FIGS. 3A and 3B are timing charts showing the operation of the reference circuit.
Figure 3B:
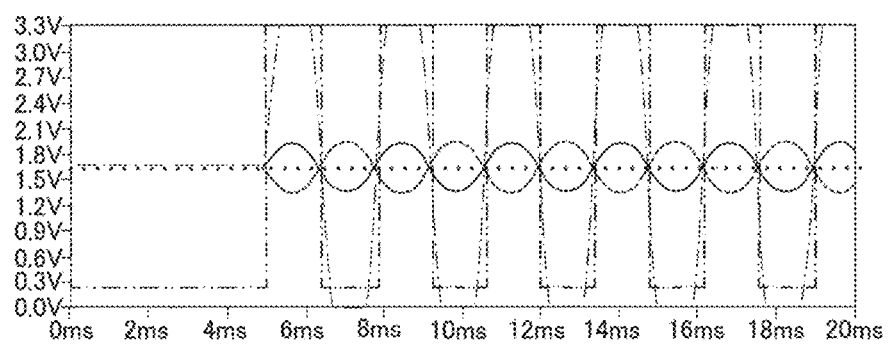

FIG. 2 is a circuit diagram of the reference circuit 6R. FIGS. 3A and 3B are timing charts showing the operation of the reference circuit 6R. Although a signal processing circuit for one Hall element H (for example, the Hall element H1)

in the Hall element group 100 is shown in the reference circuit 6R shown in FIG. 2, a signal processing for the Hall elements H of other phases (for example, the Hall elements H2 and H3) is the same.

As shown in FIG. 2, in order to generate a predetermined bias voltage or bias current for the Hall element H, resistors Rb1 and Rb2 are provided for a power supply voltage Vcc. A pair of complementary signals, that is, a Hall element signal Vh+ and a Hall element signal Vh− are output from output terminals P1 and P2 of the Hall element H, respectively. The Hall element signal Vh+ and the Hall element signal Vh− are sine wave signals having phases opposite to each other with respect to the reference voltage VR (that is, signals having different polarities with respect to the reference voltage VR).

In the example of the present embodiment, the reference voltage VR is a voltage of a half level of the power supply voltage Vcc.

The reference circuit 6R includes a signal amplifier 60 and a comparator 62. The signal amplifier 60 includes a differential amplifier 61 and resistors R1 to R4.

The differential amplifier 61 is a differential amplifier, amplifies the signals Vh+ and Vh− of the Hall element H, and outputs a signal of a voltage Vo1. The resistor R1 is provided between the output terminal P2 of the Hall element H and an inverting input terminal of the differential amplifier 61, and the resistor R3 is provided between the output terminal P1 of the Hall element H and a non-inverting input terminal of the differential amplifier 61.

A feedback resistor R2 is provided between the inverting input terminal and an output terminal of the differential amplifier 61. One end of the resistor R4 is connected to the non-inverting input terminal of the differential amplifier 61, and the other end of the resistor R4 is set to the reference voltage VR.

Typically, the signal amplifier 60 is set such that R2/R1=R4/R3, and this value becomes an amplification factor (gain) of the signal amplifier 60.

The comparator 62 (an example of a pulse signal generation unit) compares the signal (output voltage Vo1) amplified and output by the signal amplifier 60 and the reference voltage VR, and outputs a binary pulse signal (output voltage Vout) indicating a result of the comparison. This pulse signal is supplied to the CPU 5.

FIGS. 3A and 3B show simulation results of waveforms of the Hall element signals Vh+ and Vh−, the output voltage Vo1 of the differential amplifier 61, the output voltage Vout of the comparator 62, and the reference voltage VR. FIG. 3A shows a case where the amplitude of the Hall element signal is 0.2 Vp-p and the gain of the signal amplifier 60 is five times. FIG. 3B shows a case where the amplitude of the Hall element signal is 0.6 Vp-p and the gain of the signal amplifier 60 is five times.

When the output voltage Vo1 is Vp-p and exceeds the power supply voltage Vcc (3.3 V) as shown in FIG. 3B, the output voltage Vo1 is clamped and does not become a sine wave. In both the cases of FIGS. 3A and 3B, the output voltage Vout has a pulse waveform with a 50% duty.

FIGS. 3A and 3B show a case where the reference circuit 6R operates normally. However, when there is a magnetic field other than a detection target outside, an offset occurs in the Hall element signals Vh+ and Vh−, so that the output voltage Vout does not have a 50% duty. This point is shown in FIG. 4.

Figure 4:
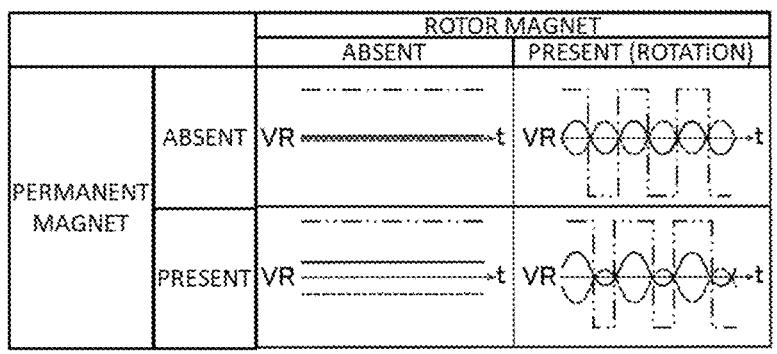
FIG. 4 is a view for describing an effect of an external magnetic field on a signal of a Hall element.
Figure 4:
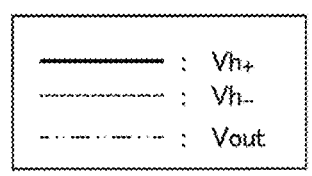

FIG. 4 is a view showing how the Hall element signals Vh+ and Vh− and the output voltage Vout (pulse) of the reference circuit 6R change between a case where there is no magnet (permanent magnet) near the three-phase AC motor M and a case where there is a magnet. If the magnet is absent near the three-phase AC motor M, Hall element signals Vh+ and Vh− of sine waves in which cross points with the reference voltage VR are present at constant intervals are generated in accordance with the rotation of a rotor magnet, thereby obtaining a pulse waveform having the output voltage Vout of the reference circuit 6R with a 50% duty.

On the other hand, if the magnet is present near the three-phase AC motor M, cross points of the Hall element signals Vh+ and Vh− with the reference voltage VR are not present at constant intervals in accordance with the rotation of the rotor magnet due to an offset component caused by the corresponding magnetic field, and thus, the output voltage Vout of the reference circuit 6R does not have a pulse waveform with a 50% duty.

Figure 5:
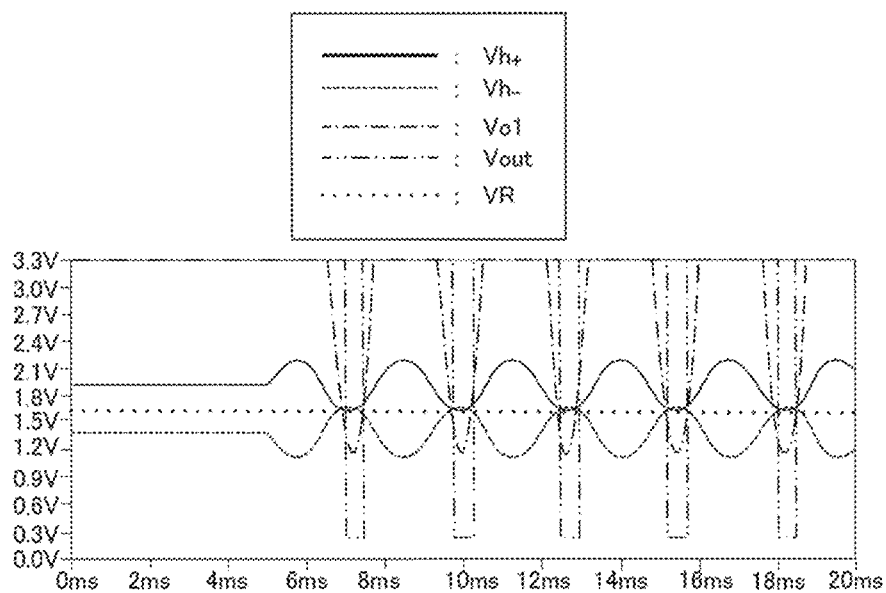
FIG. 5 is a timing chart showing the operation of the reference circuit when the external magnetic field is present.

For example, FIG. 5 shows a waveform in a case where that an amplitude of the Hall element signal in the reference circuit 6R is 0.6 Vp-p, a gain of the signal amplifier 60 is five times, and a component generated by an external magnetic field of 0.5 V (DC) is superimposed on the Hall element signal. As shown in FIG. 5, the interval between cross points of the Hall element signals Vh+ and Vh− is not constant due to the external magnetic field, and the duty ratio deviates from 50%.

Next, the arrangement of the Hall elements and the signal processing circuit 6A of the present embodiment will be described with reference to FIGS. 6A to 12.

Figure 6A:
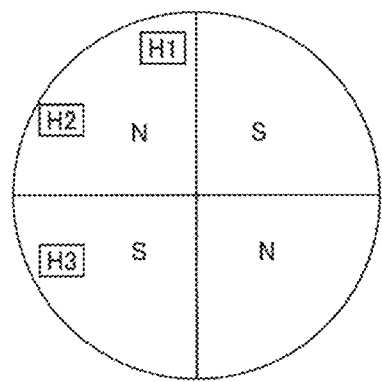
FIGS. 6A and 6B are views showing the arrangement of Hall elements of the motor drive system according to the first embodiment.
Figure 6B:
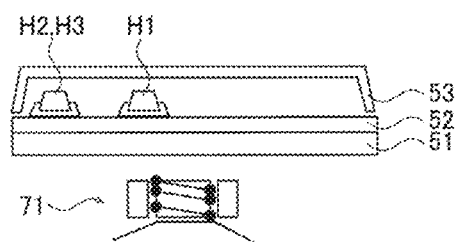
Figure 7:
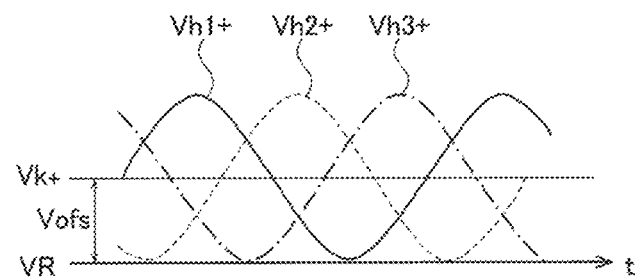
FIG. 7 is a view showing an example of an output waveform of the Hall element according to the first embodiment.

FIGS. 6A and 6B are views showing the arrangement of Hall elements of the motor drive system 1 according to the present embodiment. FIG. 7 is a view showing a signal from each Hall element on which an offset component caused by an external magnetic field is superimposed.

FIG. 6A is the view showing the arrangement of the respective Hall elements H on a plane orthogonal to a rotation axis of the motor. FIG. 6B is a schematic cross-sectional view of the motor.

In the example shown in FIG. 6A, the number of poles of the three-phase AC motor M is four (that is, the number of pole pairs is two). In this case, the Hall elements H1 to H3 generate the signals mutually having the phase difference of 120 degrees (2/3π) (in electric angle), and thus, the Hall elements H1 to H3 are arranged to be shifted each by 60 degrees (π/3) based on the relationship of electric angle=mechanical angle×number of pole pairs.

Each of the Hall elements H1 to H3 is an example of a magnetic sensor.

As shown in FIG. 6B, a substrate 52 is arranged on a pedestal 51, and the Hall elements H1 to H3 are provided on the substrate 52, in the three-phase AC motor M of the present embodiment. The substrate 52 is circular, and a rotor magnet (hereinafter, simply referred to as "rotor" as appropriate) is arranged so as to cover the substrate 52. Note that FIG. 6B shows a speaker 71 as an example of the external magnetic field.

In view of the above-described problem of the reference circuit 6R, the signal processing circuit 6A of the present embodiment removes the offset component caused by the external magnetic field by calculating a difference between an average signal (which will be described below) of Hall element signals of all phases and the Hall element signal of each phase.

Figure 12:
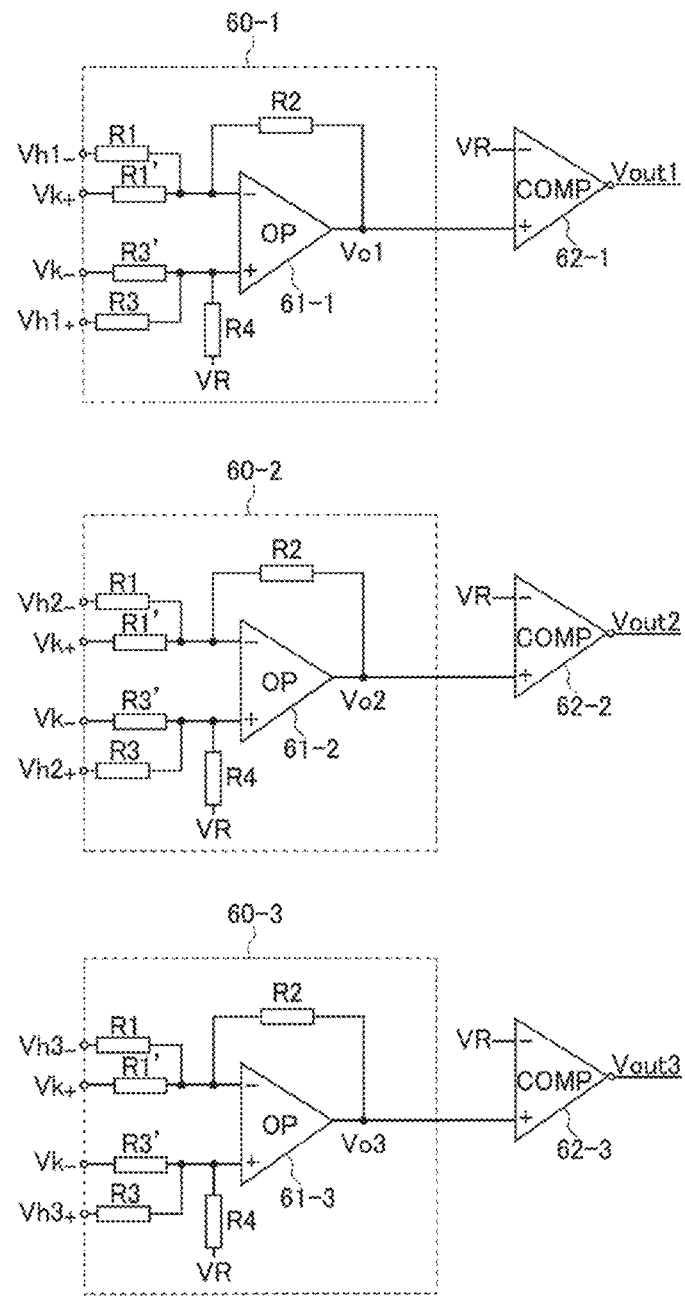
FIG. 12 is a circuit diagram of a signal amplifier according to the first embodiment.

As shown in FIG. 12, the signal processing circuit 6A of the present embodiment includes an average signal generation circuit 63A and 63B (or average signal generation circuit 65A and 65B), signal amplifiers 60-1 to 60-3, and comparators 62-1 to 62-3.

The principle of signal processing of the signal processing circuit 6A of the present embodiment will be described below with reference to FIG. 7. It is assumed a case where signals Vh1+ and Vh1− having mutually different polarities are output from the Hall element H1 corresponding to the U phase, signals Vh2+ and Vh2− having mutually different polarities are output from the Hall element H2 corresponding to the V phase, and signals Vh3+ and Vh3− having mutually different polarities are output from the Hall element H3 corresponding to the W phase. At this time, if an offset voltage Vofs of a DC component is caused by the external magnetic field of the motor, the Hall element signals Vh1+, Vh2+, and Vh3+ are sine wave signals centered on VR+Vofs in which the offset voltage Vofs caused by the external magnetic field is superimposed on the reference voltage VR, and each of the signals has a phase difference of 120 degrees (2/3π) as shown FIG. 7.

Since each of the signals has the phase difference of 120 degrees (2/3π), the Hall element signals Vh1+, Vh2+, and Vh3+ on which the offset voltage Vofs has been superimposed can be expressed by the following Equations (1), (2), and (3), respectively.

[Equation 1]
$$Vh1_+ = \sin\theta + VR + V_{ofs} \tag{1}$$

[Equation 2]
$$Vh2_+ = \sin\left(\theta - \frac{2\pi}{3}\right) + VR + V_{ofs} \tag{2}$$

[Equation 3]
$$Vh3_+ = \sin\left(\theta + \frac{2\pi}{3}\right) + VR + V_{ofs} \tag{3}$$

Therefore, Vk+, which is a signal (average signal) obtained by adding the Hall element signals Vh1+, Vh2+, and Vh3+ and multiplying the resultant value by ⅓, is expressed by the following Equation (4).

[Equation 4]
$$\begin{aligned}Vk_+ &= \frac{1}{3}(Vh1_+ + Vh2_+ + Vh3_+) \\ &= \frac{1}{3}\left(\sin\theta + 2\sin\theta\cos\left(\frac{2\pi}{3}\right) + 3VR + 3V_{ofs}\right) \\ &= VR + V_{ofs}\end{aligned} \tag{4}$$

Here, as a difference between the average signal Vk+ and each of the Hall element signals Vh1+, Vh2+, and Vh3+ is obtained, the following Equations (5) to (7) are obtained, and sine waves from which the reference voltage VR and the offset voltage have been removed and which mutually have a phase difference of 2π/3 are obtained.

[Equation 5]
$$Vh1_+ - Vk_+ = \sin\theta \tag{5}$$

[Equation 6]
$$Vh2_+ - Vk_+ = \sin\left(\theta - \frac{2\pi}{3}\right) \tag{6}$$

[Equation 7]
$$Vh3_+ - Vk_+ = \sin\left(\theta + \frac{2\pi}{3}\right) \tag{7}$$

Similarly, Vk−, which is a signal (average signal) obtained by adding the Hall element signals Vh1−, Vh2−, and Vh3− and multiplying the resultant value by ⅓, is expressed by the following Equation (8).

[Equation 8]
$$\begin{aligned}Vk_- &= \frac{1}{3}(Vh1_- + Vh2_- + Vh3_-) \\ &= VR - V_{ofs}\end{aligned} \tag{8}$$

As a difference between the average signal Vk− and each of the Hall element signals Vh1−, Vh2−, and Vh3− is obtained, signals obtained for the respective phases become sine waves from which the reference voltage VR and the offset voltage have been removed and which mutually have a phase difference of 2π/3.

Figure 8:
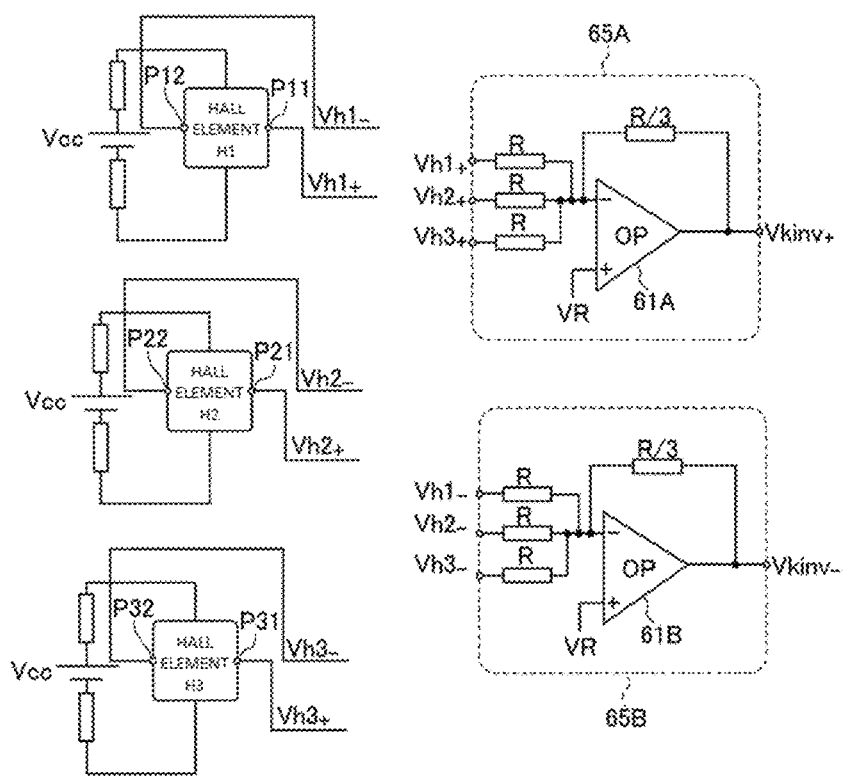
FIG. 8 is a circuit diagram of an average signal generation circuit according to the first embodiment.

FIG. 8 shows an example of the average signal generation circuit that generates the average signals Vk+ and Vk−. In the example of the present embodiment, the reference voltage VR is a voltage of a half level of the power supply voltage Vcc.

In the circuit of FIG. 8, the average signal generation circuit 65A is configured such that the Hall element signals Vh1+, Vh2+, and Vh3+ of the Hall elements H1, H2, and H3 are input in parallel to an inverting input terminal of an operational amplifier 61A via input resistors R, respectively, and a non-inverting input terminal of the operational amplifier 61A is set to the reference voltage VR. A feedback resistor R/3 is provided between the inverting input terminal and an output terminal of the operational amplifier 61A. As a value of the feedback resistor to ⅓ of the input resistor of the signal from each Hall element, a signal that is ⅓ of a signal obtained by adding the Hall element signals Vh1+, Vh2+, and Vh3+ becomes an output signal.

The average signal generation circuit 65B is configured such that the Hall element signals Vh1−, Vh2−, and Vh3− of the Hall elements H1, H2, and H3 are input in parallel to an inverting input terminal of an operational amplifier 61B via input resistors R, respectively, and a non-inverting input terminal of the operational amplifier 61B is set to the reference voltage VR. The feedback resistor R/3 is provided between the inverting input terminal and an output terminal of the operational amplifier 61B. As a value of the feedback resistor to ⅓ of the input resistor of the signal from each Hall element, a signal that is ⅓ of a signal obtained by adding the Hall element signals Vh1−, Vh2−, and Vh3− becomes an output signal.

In the circuit shown in FIG. 8, average signals Vkinv+ and Vkinv− output from the average signal generation circuits 65A and 65B are signals in which the offset voltage Vofs has been inverted with the reference voltage VR as the center.

Figure 9:
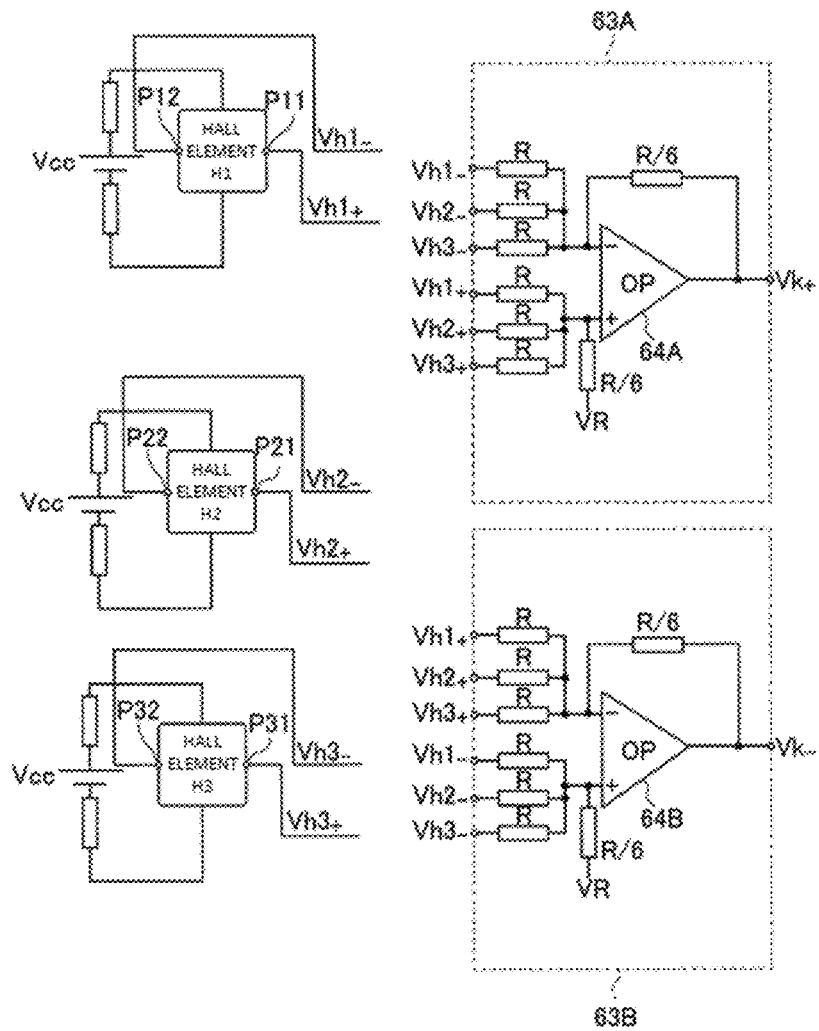
FIG. 9 is a circuit diagram of the average signal generation circuit according to the first embodiment.

It is preferable to form a differential amplifier as shown in FIG. 9 in order to avoid the inversion of the offset voltage Vofs.

The circuit shown in FIG. 9 is a circuit in which the operational amplifiers 61A and 61B of FIG. 8 are made as differential amplifiers.

In the circuit of FIG. 9, the average signal generation circuit 63A is configured such that the Hall element signals Vh1−, Vh2−, and Vh3− of the Hall elements H1, H2, and H3 are input in parallel to an inverting input terminal of a differential amplifier 64A via the input resistors R, respectively, and the Hall element signals Vh1+, Vh2+, and Vh3+ are input in parallel to a non-inverting input terminal of the differential amplifier 64A via the input resistors R, respectively. The non-inverting input terminal of the differential amplifier 64A is set to the reference voltage VR via a resistor R/6. The feedback resistor R/6 is provided between the inverting input terminal and an output terminal of the differential amplifier 64A.

The average signal generation circuit 63B is configured such that the Hall element signals Vh1+, Vh2+, and Vh3+ of the Hall elements H1, H2, and H3 are input in parallel to an inverting input terminal of the differential amplifier 64B via the input resistors R, respectively, and the Hall element signals Vh1−, Vh2−, and Vh3− are input in parallel to a non-inverting input terminal of the differential amplifier 64B via the input resistors R, respectively. The non-inverting input terminal of the differential amplifier 64B is set to the reference voltage VR via a resistor R/6. The feedback resistor R/6 is provided between the inverting input terminal and an output terminal of the differential amplifier 64B.

An output signal of the average signal generation circuit 63A in FIG. 9 is an average signal Vk+ as shown in the following Equation (9).

[Equation 9]

$$\frac{1}{6}\{(Vh1_+ + Vh2_+ + Vh3_+) - (Vh1_- + Vh2_- + Vh3_-)\} + VR = \frac{1}{6}\{(3VR + 3V_{ofs}) - (3VR - 3V_{ofs})\} + VR \quad (9)$$
$$= VR + V_{ofs} = Vk_+$$

Similarly, an output signal of the average signal generation circuit 63B of FIG. 9 is an average signal Vk− as shown by the following Equation (10).

[Equation 10]

$$\frac{1}{6}\{(Vh1_- + Vh2_- + Vh3_-) - (Vh1_+ + Vh2_+ + Vh3_+)\} + VR = \frac{1}{6}\{(3VR - 3V_{ofs}) - (3VR + 3V_{ofs})\} + VR \quad (10)$$
$$= VR - V_{ofs} = Vk_-$$

Figure 10A:
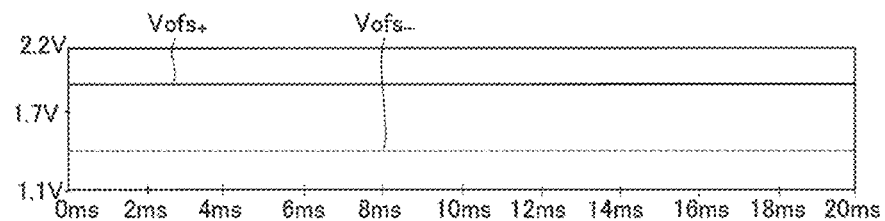
FIGS. 10A to 10D are views showing simulation results regarding a signal processing circuit of Hall element signals according to the first embodiment.

FIGS. 10A to 11D show simulation results regarding the operation of the average signal generation circuit shown in FIG. 9. A simulation condition is that the power supply voltage Vcc is 3.3 V, an amplitude of a Hall element signal of each of the U, V, and W phases from the rotor magnet is 0.6 Vp-p and a frequency is 360 Hz. FIGS. 10A to 10D show a case where a DC signal having an amplitude of 0.5 V is superimposed as an external magnetic field as shown in FIG. 10A. FIGS. 11A to 11D show a case where a signal having an amplitude of 0.5 V and a frequency of 1 kHz is superimposed on a DC offset of 0.5 V as an external magnetic field as shown in FIG. 11A.

Figure 10B:
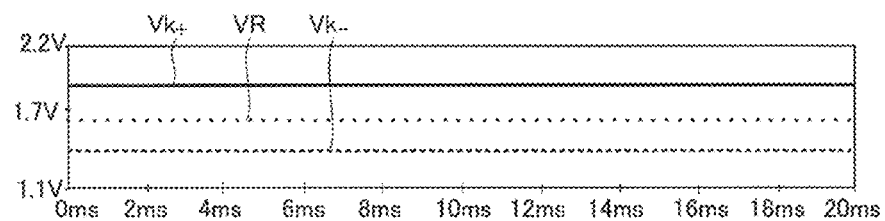
Figure 11A:
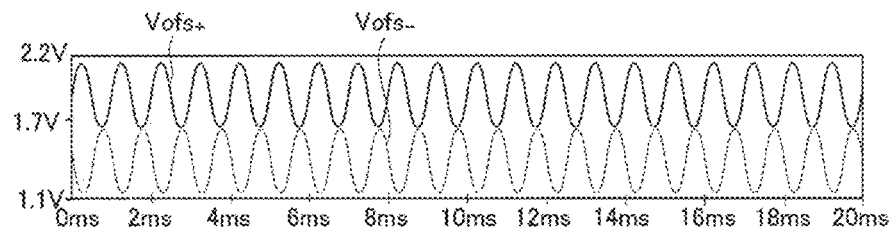
FIGS. 11A to 11D are views showing simulation results regarding the signal processing circuit of the Hall element signals according to the first embodiment.
Figure 11B:
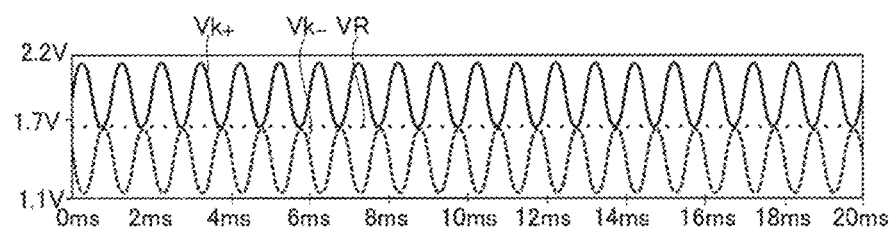

FIGS. 10B and 11B show the average signals Vk+ and Vk− obtained by the average signal generation circuits 63A and 63B of FIG. 9. As shown in FIGS. 10B and 11B, it is understood that offset signals Vofs+ and Vofs− caused by the external magnetic field based on the reference voltage VR coincide with the average signals Vk+ and Vk−.

Figure 10C:
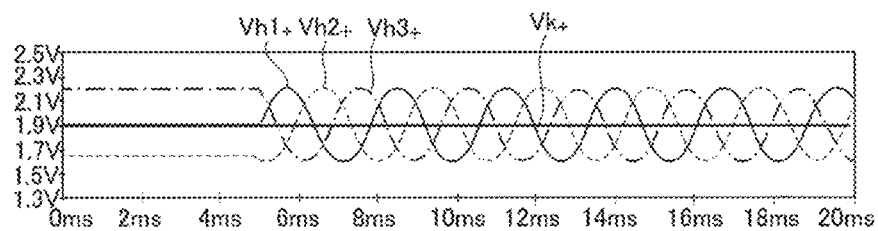
Figure 10D:
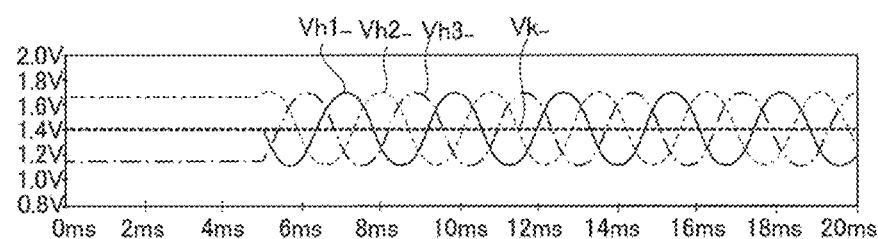
Figure 11C:
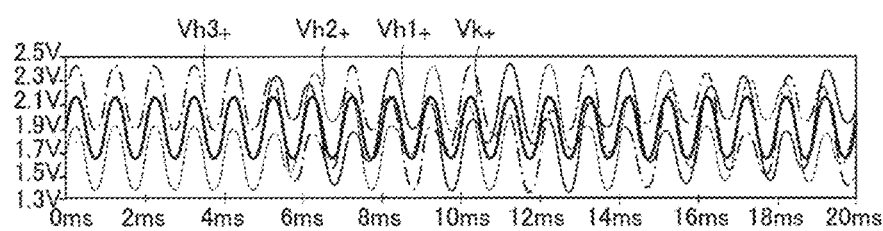
Figure 11D:
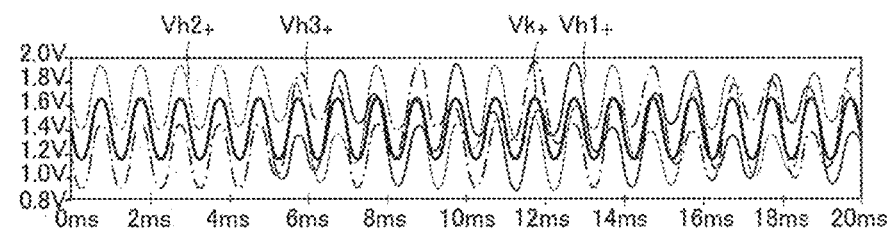

FIGS. 10C and 11C are views showing the Hall element signals Vh1+, Vh2+, and Vh3+ and the average signal Vk+. FIGS. 10D and 11D are views showing the Hall element signals Vh1−, Vh2−, and Vh3− and the average signal Vk−. As shown in FIGS. 10A to 11D, it is understood that the average signals Vk+ and Vk− have bias levels of each Hall element signal.

As shown in Equations (5) to (7), it is necessary to subtract the average signals Vk+ and Vk− obtained by the average signal generation circuits of FIG. 9 from each Hall element signal in order to remove the reference voltage VR and the offset voltage from the Hall element signal. The circuit for such removal is shown in FIG. 12.

FIG. 12 is a circuit diagram showing the signal amplifier and the comparator corresponding to each phase. That is, the U-phase circuit includes the signal amplifier 60-1, which subtracts and amplifies the average signals Vk+ and Vk− obtained by the average signal generation circuits 63A and 63B from the Hall element signals Vh1+ and Vh1−, and the comparator 62-1 serving as a pulse signal generation unit that converts an output signal Vo1 of the signal amplifier 601 into a pulse signal. The signal amplifier 60-1 has a differential amplifier 61-1 serving as a differential amplifier, and amplifies each difference between the Hall element signals Vh1+ and Vh1− and the average signals Vk+ and Vk− to output the signal having the voltage Vo1.

The comparator 62-1 compares the signal (output voltage Vo1) amplified and output by the signal amplifier 60-1 with the reference voltage VR, and outputs a binary pulse signal (output voltage Vout1) indicating a result of the comparison. This pulse signal is supplied to the CPU 5.

The V-phase circuit includes the signal amplifier 60-2, which subtracts and amplifies the average signals Vk+ and Vk− obtained by the average signal generation circuits 63A and 63B from the Hall element signals Vh2+ and Vh2−, and the comparator 62-2 serving as a pulse signal generation unit that converts an output signal Vo2 of the signal amplifier 60-2 into a pulse signal. The signal amplifier 60-2 has a differential amplifier 61-2 serving as a differential amplifier, and amplifies each difference between the Hall element signals Vh2+ and Vh2− and the average signals Vk+ and Vk− to output the signal having the voltage Vo2.

The comparator 62-2 compares the signal (output voltage Vo2) amplified and output by the signal amplifier 60-2 with the reference voltage VR, and outputs a binary pulse signal (output voltage Vout2) indicating a result of the comparison. This pulse signal is supplied to the CPU 5.

The W-phase circuit includes the signal amplifier 60-3, which subtracts and amplifies the average signals Vk+ and Vk− obtained by the average signal generation circuits 63A and 63B from the Hall element signals Vh3+ and Vh3−, and the comparator 62-3 serving as a pulse signal generation unit that converts an output signal Vo3 of the signal amplifier 60-3 into a pulse signal. The signal amplifier 60-3 has a differential amplifier 61-3 serving as a differential amplifier, and amplifies each difference between the Hall element signals Vh3+ and Vh3− and the average signals Vk+ and Vk− to output the signal having the voltage Vo3.

The comparator 62-3 compares the signal (output voltage Vo3) amplified and output by the signal amplifier 60-3 with the reference voltage VR, and outputs a binary pulse signal (output voltage Vout3) indicating a result of the comparison. This pulse signal is supplied to the CPU 5.

In FIG. 12, resistors R1, R1', R3, and R3' are input resistors, and resistor R2 is a feedback resistor. Typically, it is set such that R1=R1', R3=R3', and R2/R1=R4/R3, and these values are amplification factors (gains) of the signal amplifiers 60-1 to 60-3.

FIGS. 13A to 14F are views showing simulation results on the operation of the circuit shown in FIG. 12. A simulation condition is that the power supply voltage Vcc of the Hall element is 3.3 V, a gain of the signal amplifier is double, a signal (U-phase signal) from the rotor magnet is 0.6 Vp-p, and a frequency is 360 Hz.

FIGS. 13A to 13F show a case where a DC signal having an amplitude of 0.5 V is superimposed as an external magnetic field, and FIGS. 14A to 14F show a case where a signal having an amplitude of 0.5 V and a frequency of 1 kHz is superimposed on a DC offset of 0.5 V as an external magnetic field.

Figure 13A:
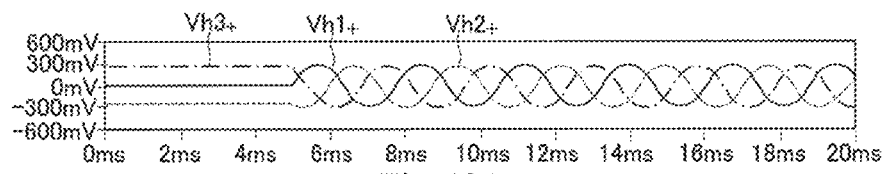
FIGS. 13A to 13F are views showing simulation results regarding the signal processing circuit of the Hall element signals according to the first embodiment.
Figure 13B:
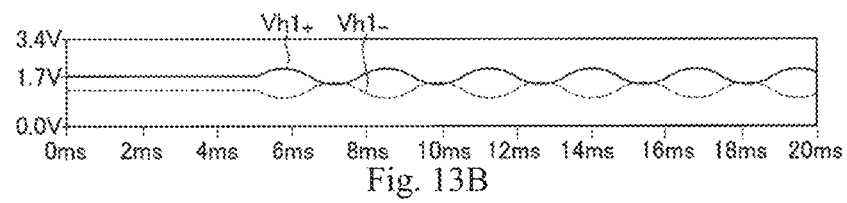
Figure 13C:
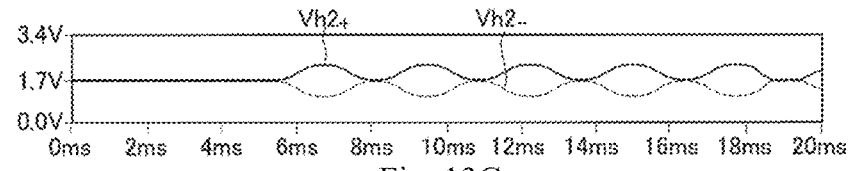
Figure 13D:
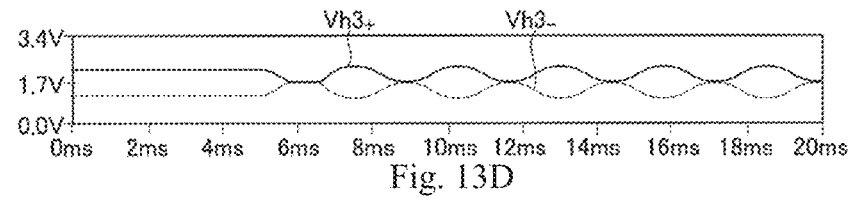
Figure 14A:
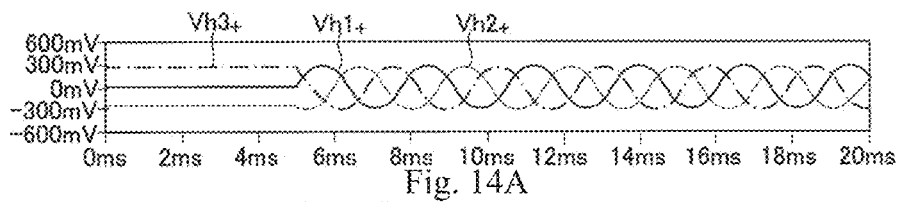
FIGS. 14A to 14F are views showing simulation results regarding the signal processing circuit of the Hall element signals according to the first embodiment.
Figure 14B:
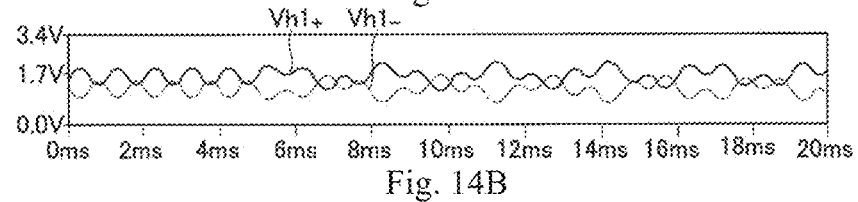
Figure 14C:
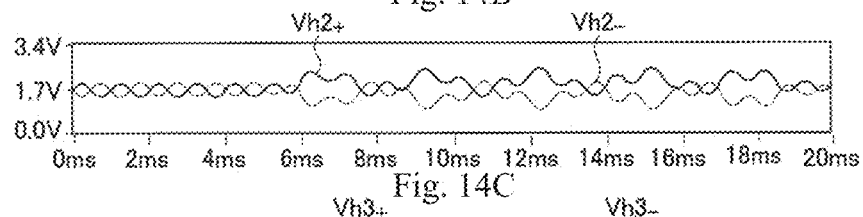
Figure 14D:
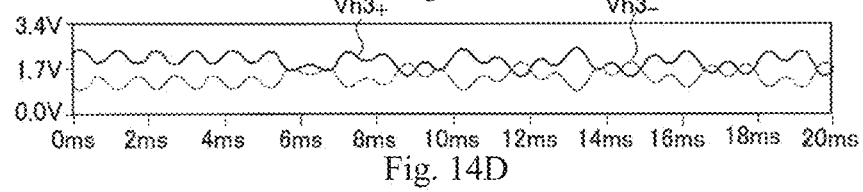

FIGS. 13A and 14A both show the Hall element signals Vh1+, Vh2+, and Vh3+ of the Hall elements H1 to H3 due to only a magnetic field generated by the rotation of the rotor.

FIGS. 13B to 13D and FIGS. 14B to 14D all show waveforms of the Hall element signals Vh1+, Vh1, −Vh2+, Vh2−, Vh3+, and Vh3− of the Hall element on which the component caused by the external magnetic field has been superimposed.

Figure 13E:
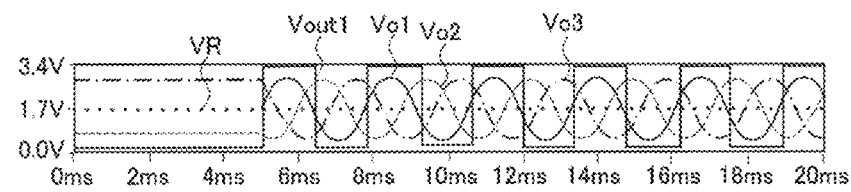
Figure 13F:
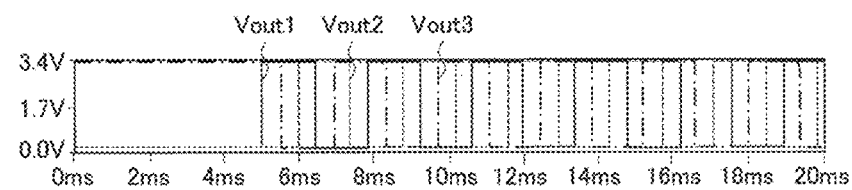
Figure 14E:
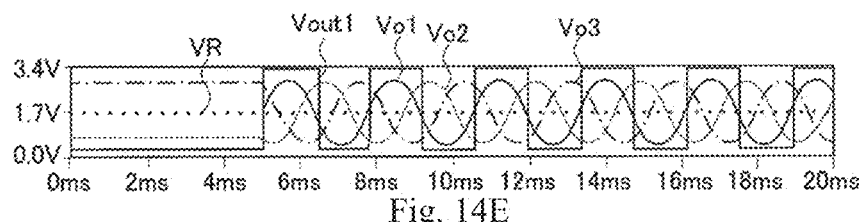
Figure 14F:
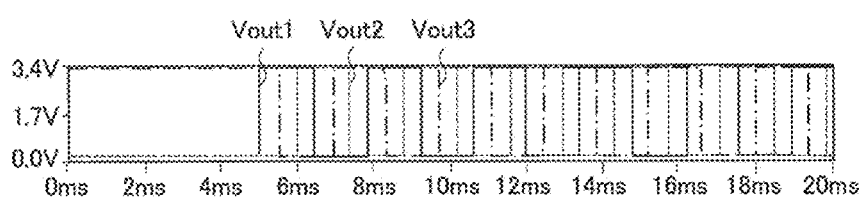

In each case, it is understood that the offset component is removed from the voltages Vo1 to Vo3 of the signal amplifiers 60-1 to 60-3 as shown in FIGS. 13E and 14E. In addition, it is understood that each duty ratio of the output voltages Vout1 to Vout3 is 50% as shown in FIGS. 13F and 14F.

As described above, the motor drive system 1 of the present embodiment is configured to remove the signal component caused by the external magnetic field by generating the average signal from Hall element signals of the Hall elements H1 to H3 that detect the rotational position of the rotor, and subtracting the average signal from each Hall element signal. Therefore, even if a noise signal level caused by the external magnetic field is DC or contains a frequency component, it is possible to remove the noise without providing an additional Hall element, and high-precision motor control becomes possible.

Next, a motor drive system according to a second embodiment will be described with reference to FIGS. 15 to 25F.

Only a signal processing circuit is different from the motor drive system 1 of the first embodiment in a motor drive system according to each of the following embodiments, and thus, only the signal processing circuit will be described.

The signal processing circuit 6A of the first embodiment is provided with the average signal generation circuits 63A and 63B (see FIG. 9) and the signal amplifiers 60-1 to 60-3 (see FIG. 12), and a lot of operational amplifiers are used. In the present embodiment, however, the number of operational amplifiers to be used is reduced by incorporating the average signal generation circuits 63A and 63B into a signal amplifier of each phase. This viewpoint will be described with reference to FIG. 15.

Figure 15:
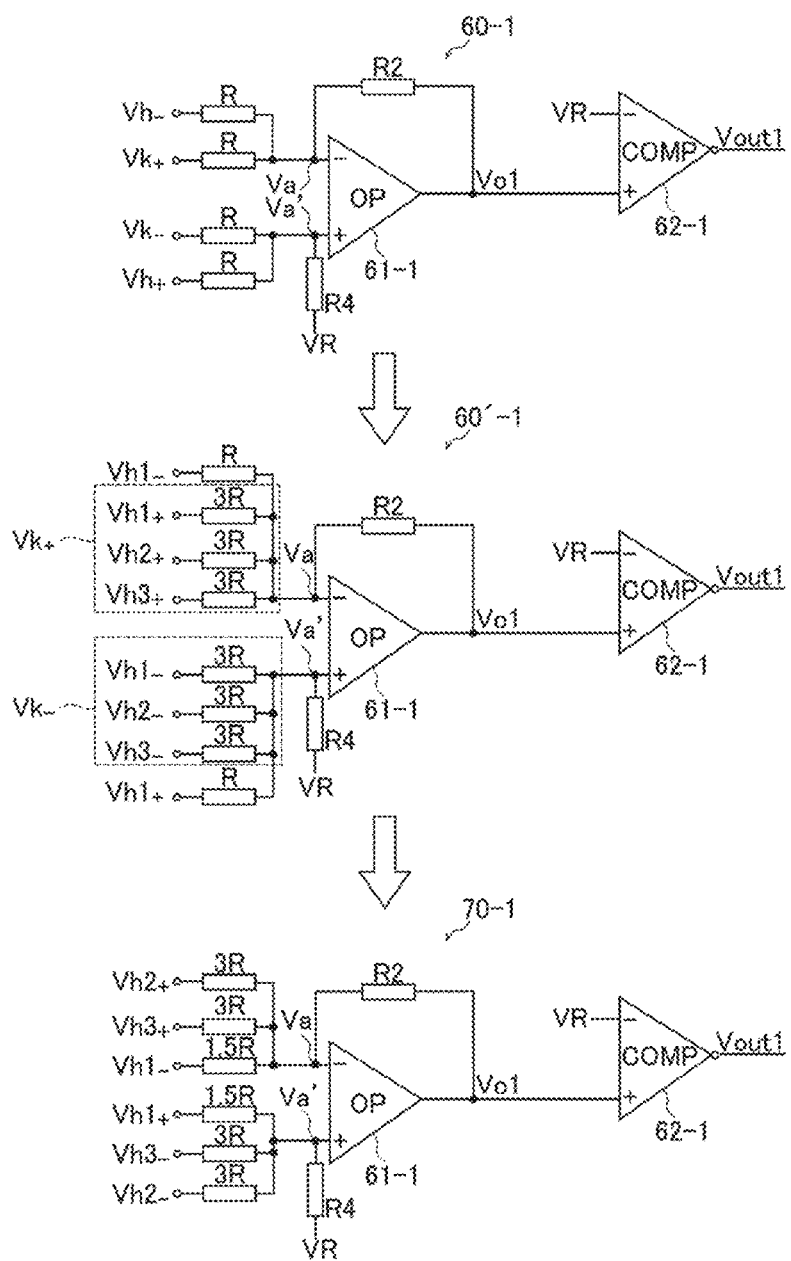
FIG. 15 is a diagram showing a signal amplifier according to a second embodiment.

The signal amplifier 60-1 shown in FIG. 15 is the same as that shown in FIG. 12. Although the average signals Vk+ and Vk− are input in the signal amplifier 60-1, a signal amplifier 60'-1 in FIG. 15 is a circuit configured to receive inputs of Hall element signals instead of the average signals Vk+ and Vk−.

As described above, the average signals Vk+ and Vk− and the Hall element signals have the relationships of the following Equations (11) and (12). Therefore, in the signal amplifier 60'-1, input resistors of the Hall element signals replacing the average signals Vk+ and Vk− are set to 3R (that is, three times the input resistor of each of the Hall element signals Vh1+ and Vh1− of the signal amplifier 60-1), so that the signal amplifier 60'-1 is equivalent to the signal amplifier 60-1.

$$Vk_+ = \tfrac{1}{3}(Vh1_+ + Vh2_+ + Vh3_+) \tag{11}$$

$$Vk_- = \tfrac{1}{3}(Vh1_- + Vh2_- + Vh3_-) \tag{12}$$

Although the signal amplifier 60'-1 in FIG. 15 has eight inputs, the Hall element signals Vh1+ and Vh1− overlap each other, and thus, the number of inputs can be reduced to six.

Here, it is assumed that a voltage of an inverting input terminal of the differential amplifier 61-1 is Va and a voltage of a non-inverting input terminal of the differential amplifier 61-1 is Va', and the Hall element signal Vh1+ will be focused. In the signal amplifier 60'-1, the Hall element signal Vh1+ is connected to the voltage Va' via the resistor R on the non-inverting input terminal side, and connected to the voltage Va via the resistor 3R on the inverting input terminal side. Therefore, a difference D+ for the Hall element signal Vh1+ is expressed by the following Equation (13).

[Equation 13]

$$D_+ = \frac{Vh1_+ - Va'}{R} - \frac{Vh1_+ - Va}{3R} \tag{13}$$

Since Va=Va' due to an imaginary short, Equation (13) becomes the following Equation (14).

[Equation 14]

$$D_+ = \frac{Vh1_+ - Va}{1.5R} \tag{14}$$

Next, the Hall element signal Vh1− will be focused. In the signal amplifier 60'-1, the Hall element signal Vh1− is connected to the voltage Va' via the resistor 3R on the non-inverting input terminal side, and connected to the voltage Va via the resistor R on the inverting input terminal side. Therefore, a difference D− for the Hall element signal Vh1− is expressed by the following Equation (15).

[Equation 15]
$$D_- = \frac{Vh1_- - Va\prime}{3R} - \frac{Vh1_- - Va}{R} \quad (15)$$

Since Va=Va' due to an imaginary short, Equation (15) becomes the following Equation (16).

[Equation 16]
$$D_- = \frac{Va - Vh1_-}{1.5R} \quad (16)$$

According to the above Equations (14) and (16), it is understood that the Hall element signal Vh1+ may be input to the non-inverting input terminal via a resistor 1.5R, and the Hall element signal Vh1− may be input to the inverting input terminal via a resistor 1.5R in order to reduce each of the inputs of the two Hall element signals Vh1+ and the inputs of the two Hall element signals Vh1− of the signal amplifier 60'-1 having eight inputs to one input. A circuit having six inputs in this manner is a signal amplifier 70-1 in FIG. 15. That is, the signal amplifier 70-1 is equivalent to the signal amplifier 60'-1. In the signal amplifier 70-1 in FIG. 15, a feedback resistor is set to nR (n times the resistor R), but the value of n can be set as appropriate.

Although the signal processing circuit corresponding to the U phase has been described above, the number of operational amplifiers can be reduced in the same manner for the V phase and the W phase.

Figure 16:
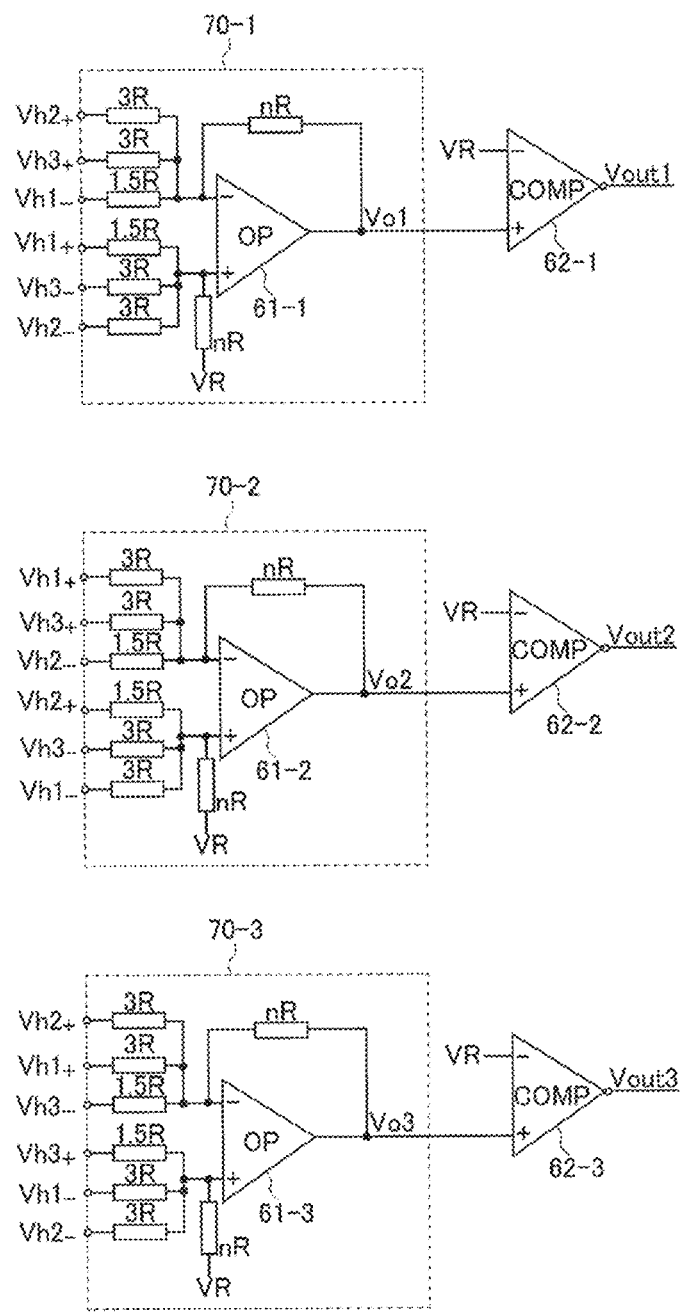
FIG. 16 is a circuit diagram of the signal amplifier according to the second embodiment.

FIG. 16 shows signal amplifiers 70-1, 70-2, and 70-3 (hereinafter, also collectively referred to as "signal amplifier 70") of the signal processing circuit of the present embodiment. The signal amplifier 70-1 is the same as that shown in FIG. 15. The signal amplifiers 70-2 and 70-3 are circuits corresponding to the V phase and the W phase, respectively.

FIGS. 17A to 17F and the subsequent drawings show results obtained by performing simulation on the signal processing circuit (that is, the circuit including the signal amplifier 70) of Hall element signals of the present embodiment.

First, FIGS. 17A to 18F show results of simulation performed under a condition that the power supply voltage Vcc of the Hall element is 3.3 V, a gain of the signal amplifier is twice, and a signal of each phase from the rotor magnet has an amplitude of 0.6 Vp-p and a frequency of 360 Hz. FIGS. 17A to 17F show a case where a DC signal having an amplitude of 0.5 V is superimposed as an external magnetic field, and FIGS. 18A to 18F show a case where a signal having an amplitude of 0.5 V and a frequency of 1 kHz is superimposed on a DC offset of 0.5 V as an external magnetic field.

Figure 17A:
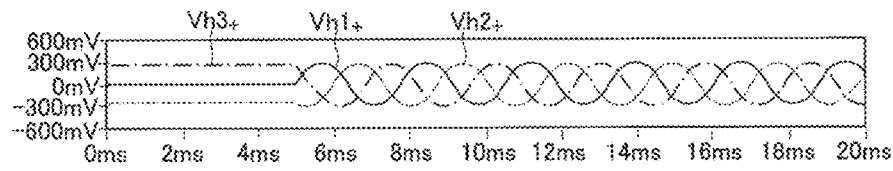
FIGS. 17A to 17F are views showing simulation results regarding a signal processing circuit of Hall element signals according to the second embodiment.
Figure 18A:
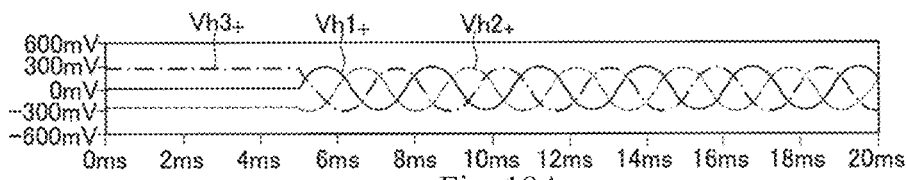
FIGS. 18A to 18F are views showing simulation results regarding the signal processing circuit of the Hall element signals according to the second embodiment.

FIGS. 17A and 18A both show the Hall element signals Vh1+, Vh2+, and Vh3+ of the Hall elements H1 to H3 due to only a magnetic field generated by the rotation of the rotor.

Figure 17B:
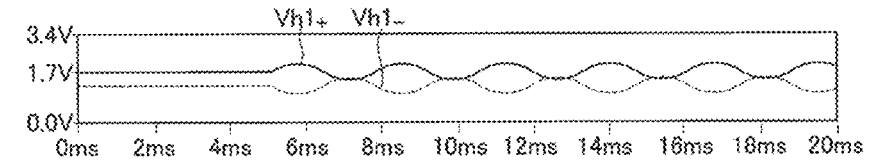
Figure 17C:
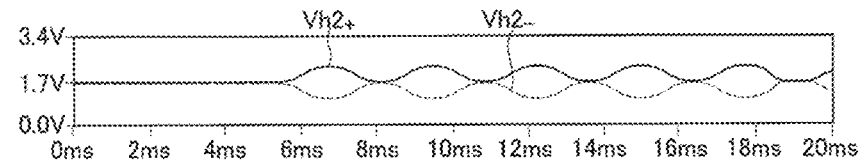
Figure 17D:
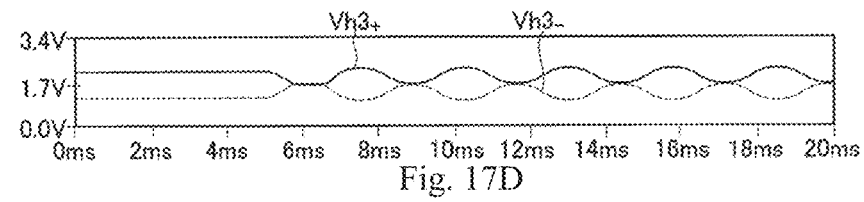
Figure 17E:
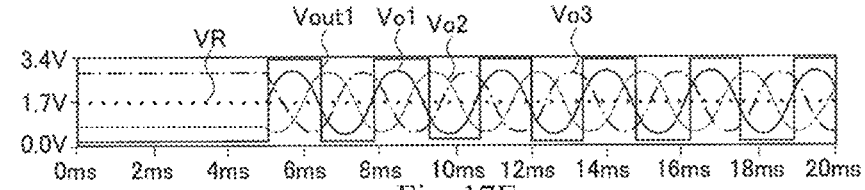
Figure 17F:
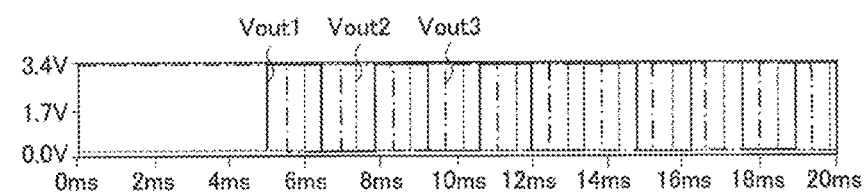
Figure 18B:
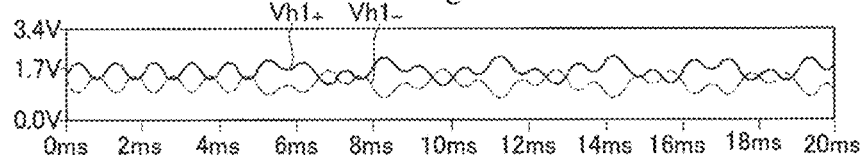
Figure 18C:
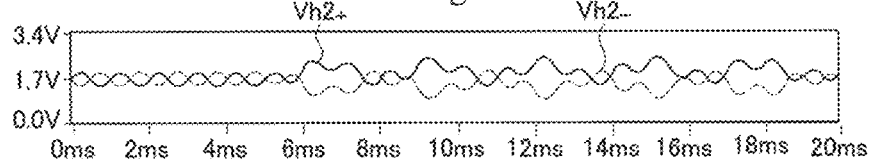
Figure 18D:
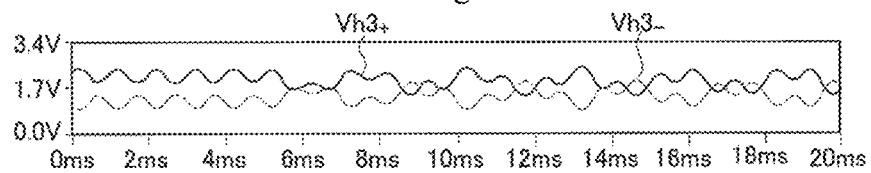
Figure 18E:
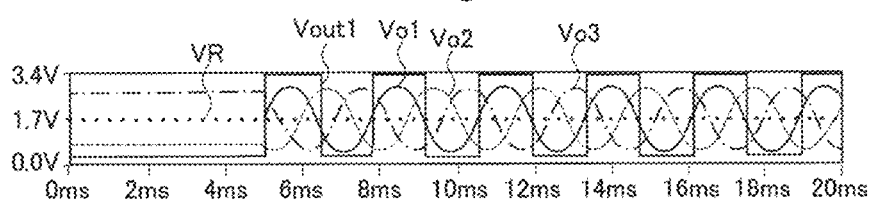
Figure 18F:
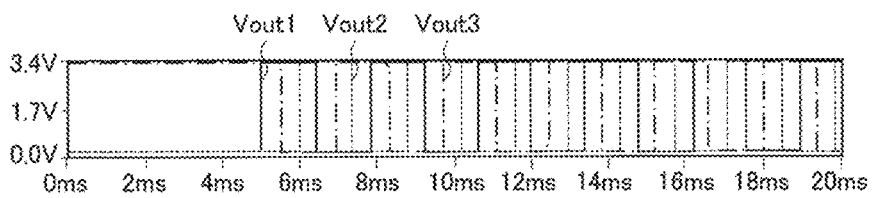
Figure 19A:
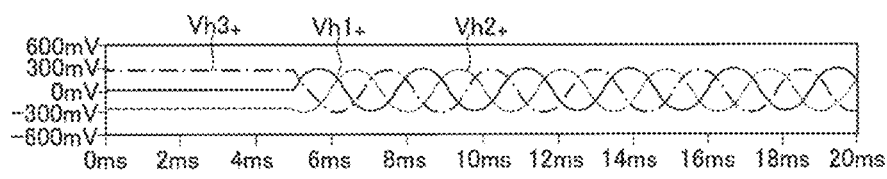
FIGS. 19A to 19F are views showing simulation results regarding the signal processing circuit of the Hall element signals according to the second embodiment.
Figure 19B:
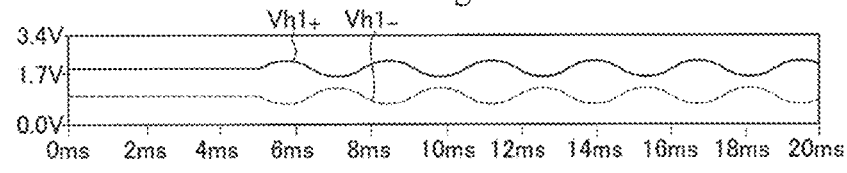
Figure 19C:
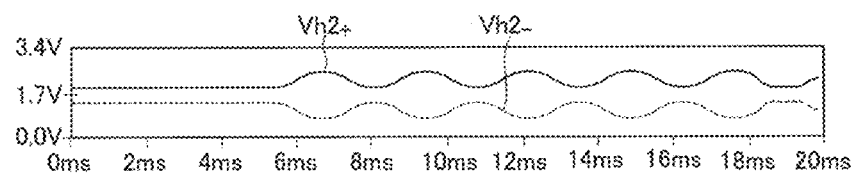
Figure 19D:
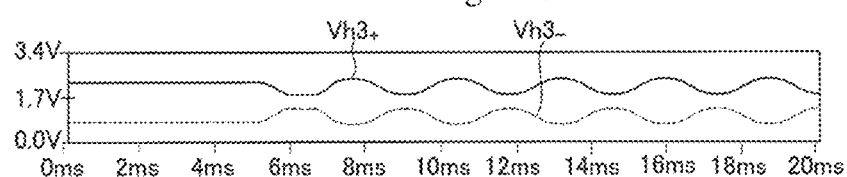
Figure 19E:
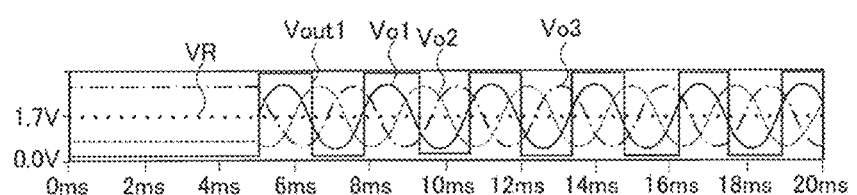
Figure 19F:
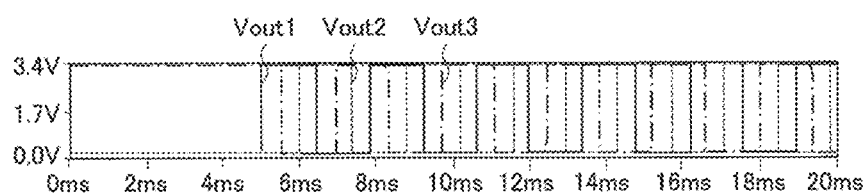
Figure 20A:
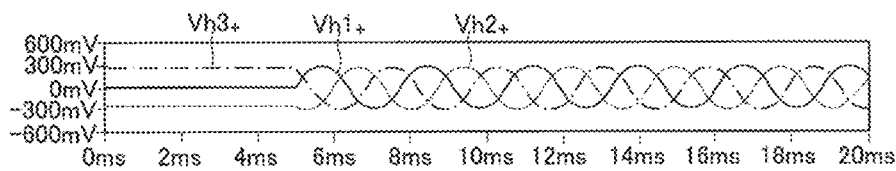
FIGS. 20A to 20F are views showing simulation results regarding the signal processing circuit of the Hall element signals according to the second embodiment.
Figure 20B:
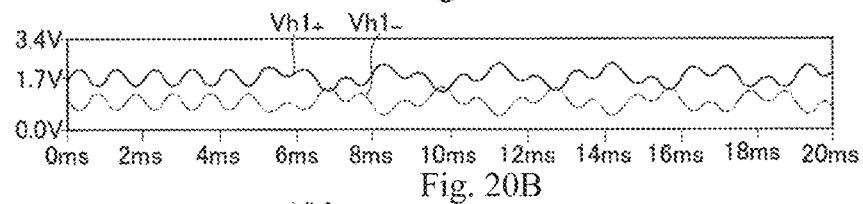
Figure 20C:
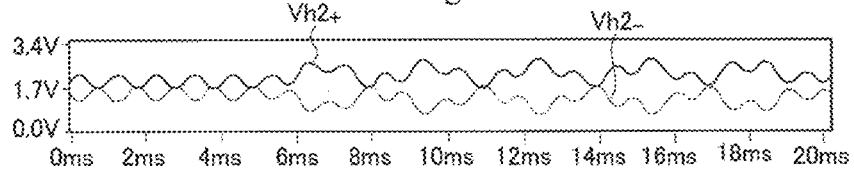
Figure 20D:
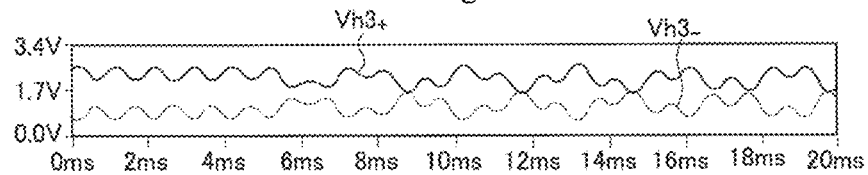
Figure 20E:
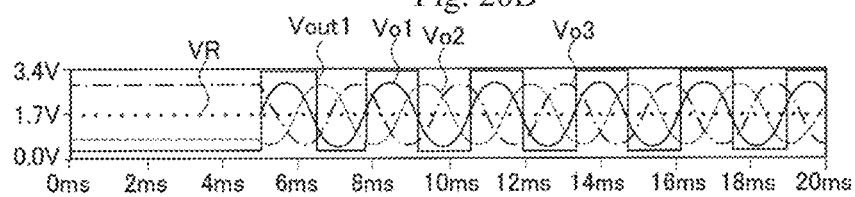
Figure 20F:
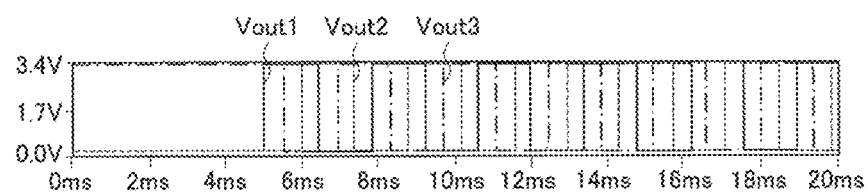
Figure 21A:
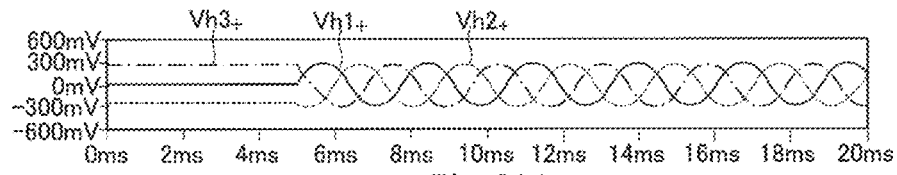
FIGS. 21A to 21F are views showing simulation results regarding the signal processing circuit of the Hall element signals according to the second embodiment.
Figure 21B:
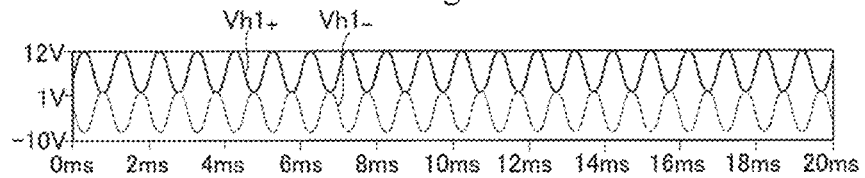
Figure 21C:
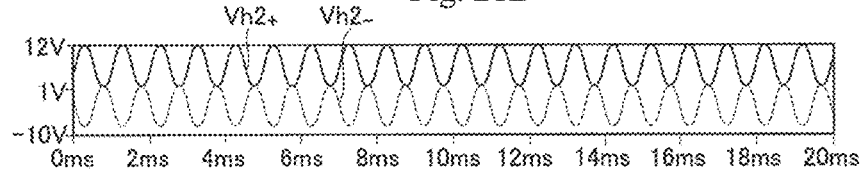
Figure 21D:
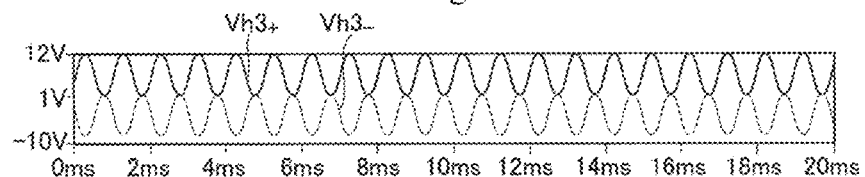
Figure 21E:
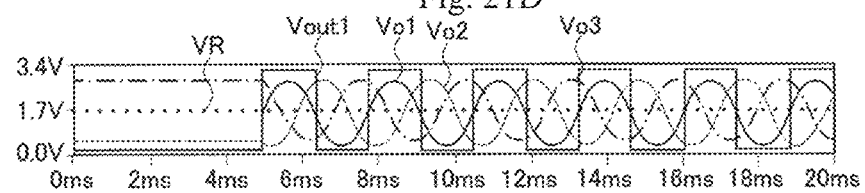
Figure 21F:
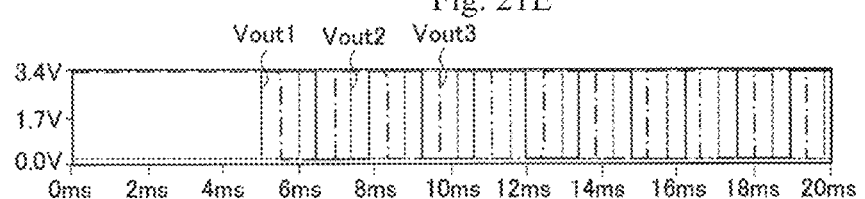
Figure 22A:
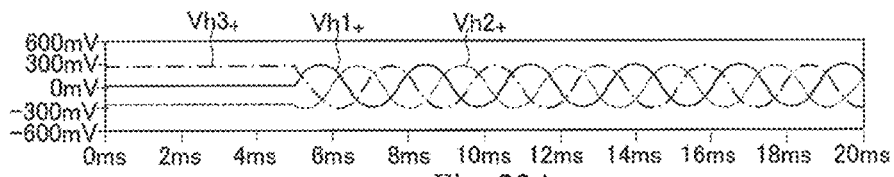
FIGS. 22A to 22F are views showing simulation results regarding a signal processing circuit of Hall element signals according to the second embodiment.
Figure 22B:
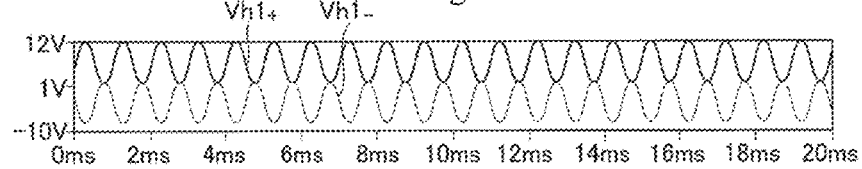
Figure 22C:
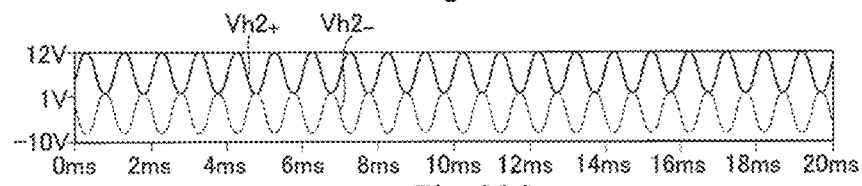
Figure 22D:
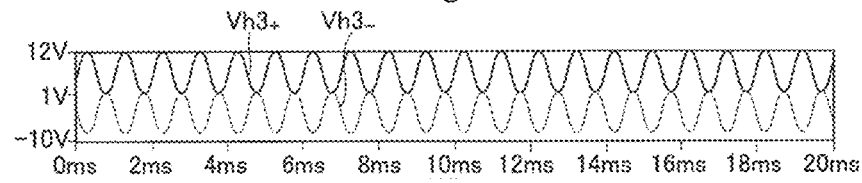
Figure 22E:
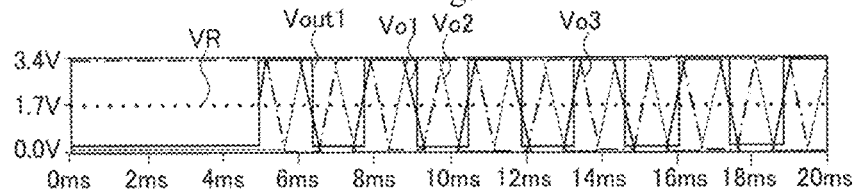
Figure 22F:
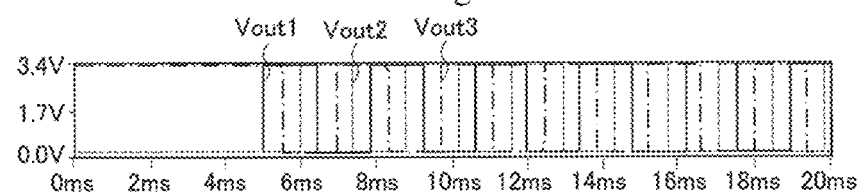
Figure 23A:
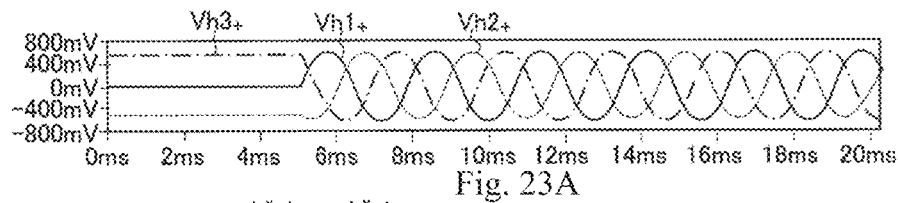
FIGS. 23A to 23F are views showing simulation results regarding a signal processing circuit of Hall element signals according to the second embodiment.
Figure 23B:
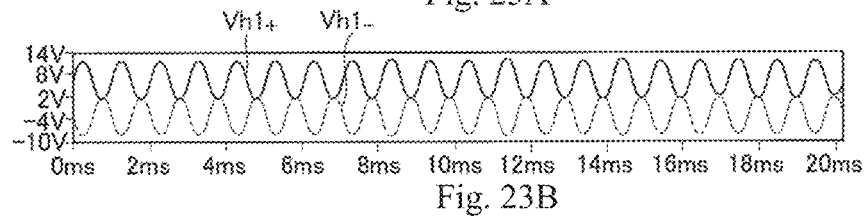
Figure 23C:
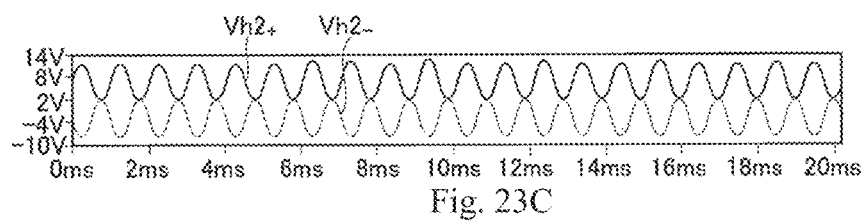
Figure 23D:
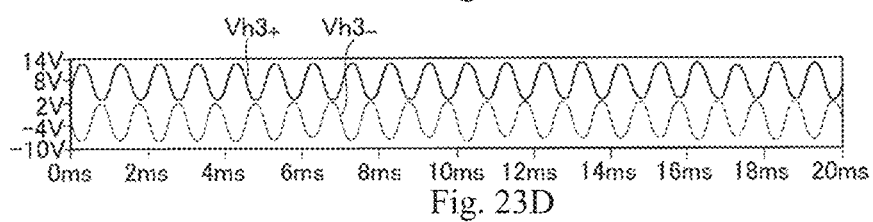
Figure 23E:
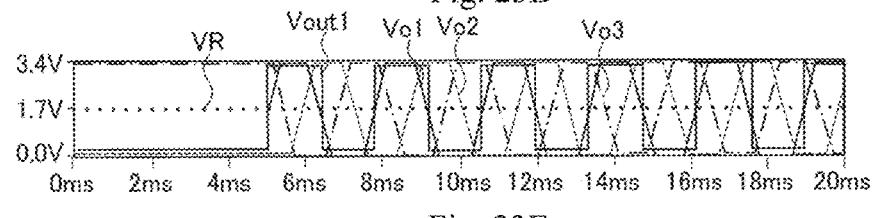
Figure 23F:
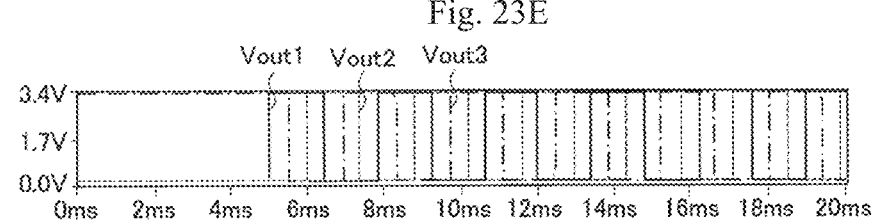
Figure 24A:
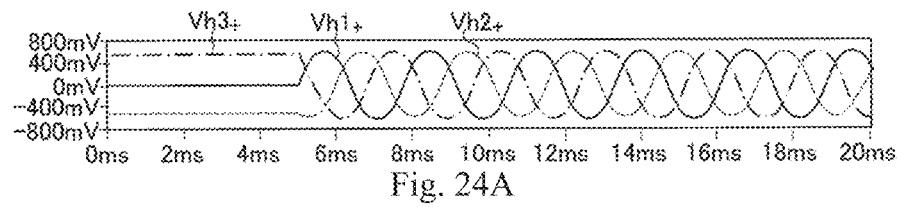
FIGS. 24A to 24F are views showing simulation results regarding a signal processing circuit of Hall element signals according to the second embodiment.
Figure 24B:
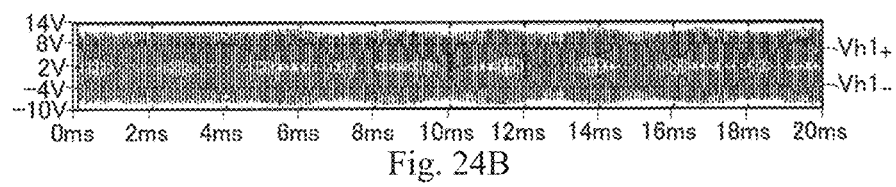
Figure 24C:
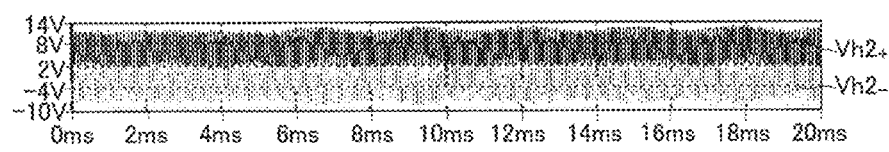
Figure 24D:
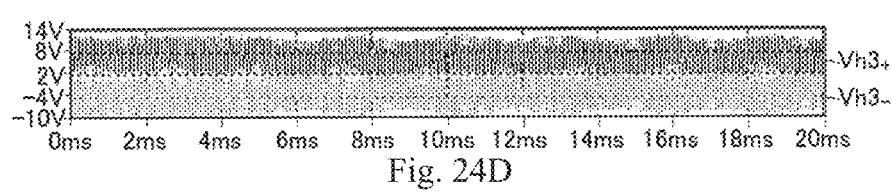
Figure 24E:
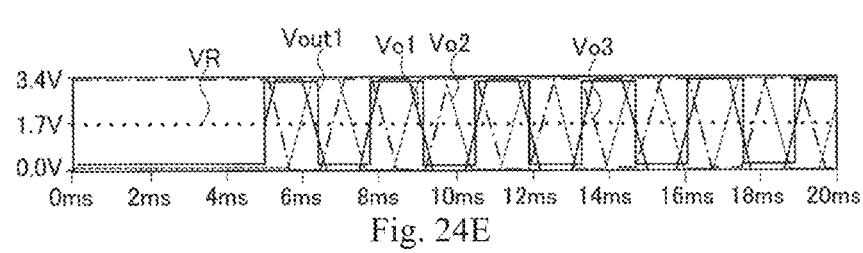
Figure 24F:
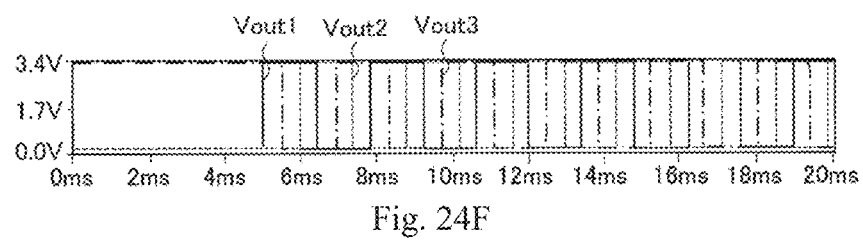
Figure 25A:
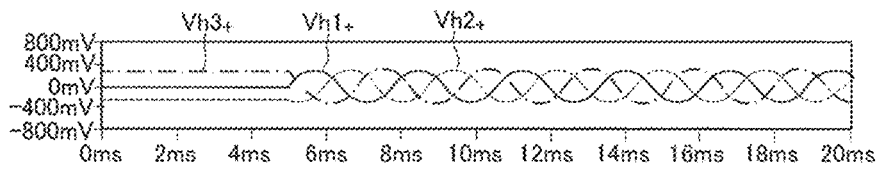
FIGS. 25A to 25F are views showing simulation results regarding a signal processing circuit of Hall element signals according to the second embodiment.
Figure 25B:
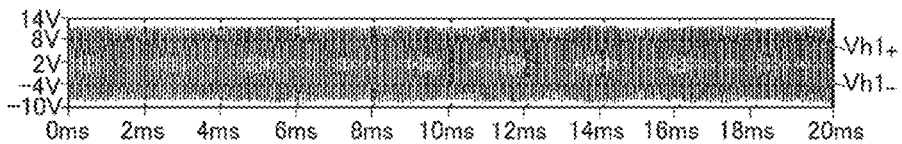
Figure 25C:
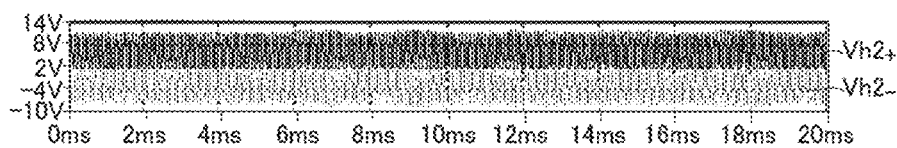
Figure 25D:
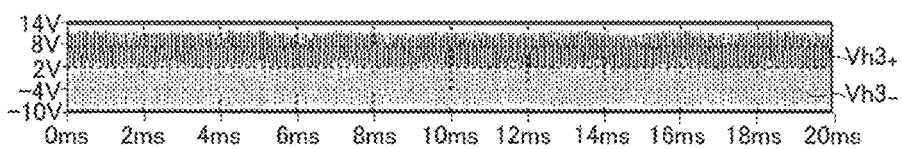
Figure 25E:
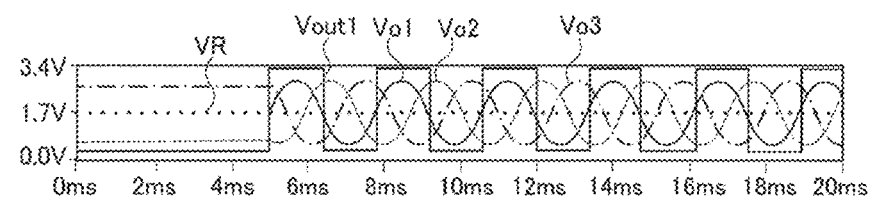
Figure 25F:
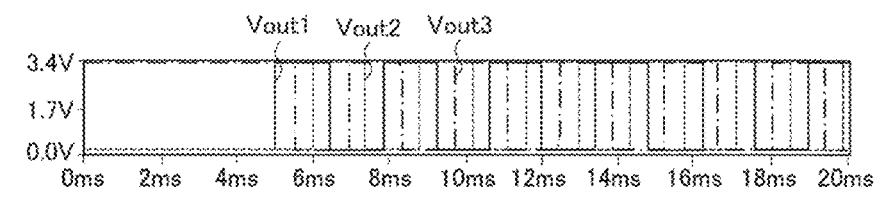

FIGS. 17B and 18B both show waveforms of the Hall element signals Vh1+ and Vh1− of the Hall element H1 on which a component caused by the external magnetic field is superimposed. FIGS. 17C and 18C both show waveforms of the Hall element signals Vh2+ and Vh2− of the Hall element H2 on which a component caused by the external magnetic field is superimposed. FIGS. 17D and 18D both show waveforms of the Hall element signals Vh3+ and Vh3− of the Hall element H3 on which a component caused by the external magnetic field is superimposed. FIGS. 17E and 18E show waveforms of outputs Vo1, Vo2, and Vo3 of the signal amplifiers corresponding to the respective phases, the reference voltage VR, and the output voltage Vout1 of the U phase. FIGS. 17F and 18F show waveforms of output voltages Vout1, Vout2, and Vout3 of the signal processing circuits of the respective phases.

In each case, it has been confirmed that a signal component of the external magnetic field is removed from the outputs Vo1, Vo2, and Vo3 of the signal amplifiers and each duty ratio of the output voltage Vout1, Vout2, and Vout3 of the respective phases is 50%.

Each view of FIGS. 19A to 25F show a waveform similar to that in FIGS. 17A to 18F obtained when the offset voltage Vofs and its frequency caused by the external magnetic field, the amplitude of the Hall element signal, and the gain of the differential amplifier are changed. The notation format of the waveform is the same as that in FIGS. 17A to 18F.

Specifically, it is noted as follows.

FIGS. 19A to 19F show waveforms of the respective signals when the external magnetic field is DC having 1 V (that is, the offset voltage Vofs=1 V), an amplitude of the Hall element signal is 0.6 Vp-p, and a gain of the signal amplifier 70 is twice.

FIGS. 20A to 20F show waveforms of the respective signals when a signal caused by the external magnetic field is a signal having an amplitude of 0.5 V and a frequency of 1 kHz centered on the offset voltage Vofs of 1 V, an amplitude of the Hall element signal is 0.6 Vp-p, and a gain of the signal amplifier 70 is twice.

FIGS. 21A to 21F show waveforms of the respective signals when a signal caused by the external magnetic field is a signal having an amplitude of 10 V and a frequency of 1 kHz centered on the offset voltage Vofs of 10 V, an amplitude of the Hall element signal is 0.6 Vp-p, and a gain of the signal amplifier 70 is twice.

FIGS. 22A to 22F show waveforms of the respective signals when a signal caused by the external magnetic field is a signal having an amplitude of 10 V and a frequency of 1 kHz centered on the offset voltage Vofs of 10 V, an amplitude of the Hall element signal is 0.6 Vp-p, and a gain of the signal amplifier 70 is five times.

FIGS. 23A to 23F show waveforms of the respective signals when a signal caused by the external magnetic field is a signal having an amplitude of 10 V and a frequency of 1 kHz centered on the offset voltage Vofs of 10 V, an amplitude of the Hall element signal is 1.2 Vp-p, and a gain of the signal amplifier 70 is twice.

FIGS. 24A to 24F show waveforms of the respective signals when a signal caused by the external magnetic field is a signal having an amplitude of 10 V and a frequency of 10 kHz centered on the offset voltage Vofs of 10 V, an amplitude of the Hall element signal is 1.2 Vp-p, and a gain of the signal amplifier 70 is twice.

FIGS. 25A to 25F show waveforms of the respective signals when a signal caused by the external magnetic field is a signal having an amplitude of 10 V and a frequency of 10 kHz centered on the offset voltage Vofs of 10 V, an amplitude of the Hall element signal is 0.6 Vp-p, and a gain of the signal amplifier 70 is twice.

As can be seen from each view of FIGS. 19A to 25F, it is understood that the signal caused by the external magnetic field is removed even when the offset voltage Vofs and its frequency caused by the external magnetic field, the amplitude of the Hall element signal, and the gain of the differential amplifier have been changed. Therefore, even with the signal processing circuit of the present embodiment, the high-precision motor control can be performed as in the first embodiment.

As described above, the embodiments of the motor according to the present disclosure have been described in detail. However, a scope of the present disclosure is not limited to the above embodiments. In addition, the above-described embodiments can be variously improved or changed within the scope not departing from a gist of the present disclosure. The technical matters described in each of the plurality of embodiments can be appropriately combined.

For example, the case where the on/off control of each driving MOS transistor of the three-phase voltage generation unit 10 is performed by 120-degree energization based on position information of a Hall sensor has been described in the above-described embodiments, but the disclosure is not limited thereto. As an on/off control method of each driving MOS transistor, another energization control method such as 180-degree energization may be applied.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A motor, comprising:
a plurality of magnetic sensors that output sine wave signals having a certain phase difference in order in accordance with rotation of a rotor;
a signal amplifier that amplifies a difference between an output signal of each of the plurality of magnetic sensors and an average signal that is an average of the output signals of the plurality of magnetic sensors; and
a pulse signal generation unit that converts an output signal of the signal amplifier into a pulse signal, wherein
the sine wave signal output from each of the plurality of magnetic sensors is a signal based on a reference voltage,
the signal amplifier comprises:
an average signal generation circuit comprising: a first operational amplifier having an input terminal to which output signals of the plurality of magnetic sensors are input in parallel via input resistors, respectively; and a feedback resistor of the first operational amplifier set such that an output signal of the first operational amplifier is the average signal based on the reference voltage; and
a plurality of second operational amplifiers that amplifies a difference between each of the output signals of the plurality of magnetic sensors and the average signal generated by the average signal generation circuit, and
the pulse signal generation unit generates the pulse signal based on a comparison result between an output signal of each of the plurality of second signal amplification circuit and the reference voltage.

2. A motor, comprising:
a plurality of magnetic sensors that output sine wave signals having a certain phase difference in order in accordance with rotation of a rotor;
a signal amplifier that amplifies a difference between an output signal of each of the plurality of magnetic sensors and an average signal that is an average of the output signals of the plurality of magnetic sensors; and
a pulse signal generation unit that converts an output signal of the signal amplifier into a pulse signal, wherein
the sine wave signal output from each of the plurality of magnetic sensors is a signal based on a reference voltage,
the signal amplifier comprises a plurality of operational amplifiers corresponding to the respective magnetic sensors and having input terminals to which output signals of the plurality of magnetic sensors are input in parallel, respectively,
each of the operational amplifiers is provided with an input resistor and a feedback resistor so as to output a signal obtained by amplifying a difference between the output signal of the corresponding magnetic sensor and the average signal, and
the pulse signal generation unit generates the pulse signal based on a comparison result between an output signal of each of the plurality of operational amplifiers and the reference voltage.

* * * * *